(12) United States Patent
Nealey et al.

(10) Patent No.: US 9,183,870 B2
(45) Date of Patent: Nov. 10, 2015

(54) DENSITY MULTIPLICATION AND IMPROVED LITHOGRAPHY BY DIRECTED BLOCK COPOLYMER ASSEMBLY

(75) Inventors: Paul Franklin Nealey, Madison, WI (US); Huiman Kang, Madison, WI (US); Francois Detcheverry, Madison, WI (US); Juan J. De Pablo, Madison, WI (US); Ricardo Ruiz, San Bruno, CA (US); Thomas Albrecht, San Jose, CA (US)

(73) Assignees: Wisconsin Alumni Research Foundation, Madison, WI (US); HGST Netherlands B.V., Amsterdam (NL)

(*) Notice: Subject to any disclaimer, the term of this patent is extended or adjusted under 35 U.S.C. 154(b) by 836 days.

(21) Appl. No.: 12/329,484

(22) Filed: Dec. 5, 2008

(65) Prior Publication Data
US 2009/0196488 A1 Aug. 6, 2009

Related U.S. Application Data

(60) Provisional application No. 61/005,721, filed on Dec. 7, 2007, provisional application No. 61/068,912, filed on Mar. 10, 2008, provisional application No. 61/189,085, filed on Aug. 15, 2008.

(51) Int. Cl.
*G11B 5/64* (2006.01)
*G11B 5/855* (2006.01)
(Continued)

(52) U.S. Cl.
CPC ............ *G11B 5/855* (2013.01); *B81C 1/00031* (2013.01); *B82Y 10/00* (2013.01);
(Continued)

(58) Field of Classification Search
USPC .................................................. 428/827–829
See application file for complete search history.

(56) References Cited

U.S. PATENT DOCUMENTS

| 3,444,732 A | 5/1969 | McKinley et al. |
| 4,235,657 A | 11/1980 | Greenman et al. |

(Continued)

FOREIGN PATENT DOCUMENTS

| JP | 10-330494 | 12/1998 |
| JP | 2004-087531 | 3/2004 |

(Continued)

OTHER PUBLICATIONS

U.S. Appl. No. 11/545,060, filed Oct. 5, 2006, Nealey et al.
(Continued)

*Primary Examiner* — Holly Rickman
*Assistant Examiner* — Linda Chau
(74) *Attorney, Agent, or Firm* — Weaver Austin Villeneuve & Sampson LLP

(57) ABSTRACT

Methods to pattern substrates with dense periodic nanostructures that combine top-down lithographic tools and self-assembling block copolymer materials are provided. According to various embodiments, the methods involve chemically patterning a substrate, depositing a block copolymer film on the chemically patterned imaging layer, and allowing the block copolymer to self-assemble in the presence of the chemically patterned substrate, thereby producing a pattern in the block copolymer film that is improved over the substrate pattern in terms feature size, shape, and uniformity, as well as regular spacing between arrays of features and between the features within each array compared to the substrate pattern. In certain embodiments, the density and total number of pattern features in the block copolymer film is also increased. High density and quality nanoimprint templates and other nanopatterned structures are also provided.

20 Claims, 17 Drawing Sheets

(51) Int. Cl.
*B81C 1/00* (2006.01)
*B82Y 10/00* (2011.01)
*B82Y 30/00* (2011.01)
*B82Y 40/00* (2011.01)
*G03F 7/00* (2006.01)
*G11B 5/74* (2006.01)
*G11B 5/82* (2006.01)

(52) U.S. Cl.
CPC ............... *B82Y 30/00* (2013.01); *B82Y 40/00* (2013.01); *G03F 7/0002* (2013.01); *G11B 5/743* (2013.01); *G11B 5/746* (2013.01); *G11B 5/82* (2013.01); *B81C 2201/0149* (2013.01)

(56) References Cited

U.S. PATENT DOCUMENTS

| | | | |
|---|---|---|---|
| 5,948,470 | A | 9/1999 | Harrison et al. |
| 6,146,755 | A * | 11/2000 | Guha et al. ............... 428/332 |
| 6,162,532 | A * | 12/2000 | Black et al. ............... 428/323 |
| 6,565,763 | B1 | 5/2003 | Asakawa et al. |
| 6,746,825 | B2 | 6/2004 | Nealey et al. |
| 6,893,705 | B2 | 5/2005 | Thomas |
| 6,926,953 | B2 | 8/2005 | Nealey et al. |
| 6,947,235 | B2 | 9/2005 | Albrecht et al. |
| 7,704,432 | B2 | 4/2010 | Dumond et al. |
| 7,763,319 | B2 | 7/2010 | Cheng et al. |
| 7,901,607 | B2 | 3/2011 | Xu et al. |
| 7,959,975 | B2 | 6/2011 | Millward |
| 8,003,236 | B2 | 8/2011 | Albrecht et al. |
| 8,133,341 | B2 | 3/2012 | Nealey et al. |
| 8,133,534 | B2 | 3/2012 | Nealey et al. |
| 8,168,284 | B2 | 5/2012 | Nealey et al. |
| 8,186,284 | B2 | 5/2012 | Westbrook et al. |
| 8,287,957 | B2 | 10/2012 | Nealey et al. |
| 8,501,304 | B2 | 8/2013 | Stoykovich et al. |
| 8,618,221 | B2 | 12/2013 | Nealey et al. |
| 8,623,493 | B2 | 1/2014 | Nealey et al. |
| 2002/0132083 | A1 | 9/2002 | Weller et al. |
| 2003/0091752 | A1 | 5/2003 | Nealey et al. |
| 2003/0091865 | A1* | 5/2003 | Chen et al. ............... 428/693 |
| 2004/0091748 | A1* | 5/2004 | Kamata et al. ............ 428/694 T |
| 2004/0143063 | A1 | 7/2004 | Chen et al. |
| 2004/0174257 | A1 | 9/2004 | Kuhns et al. |
| 2006/0134556 | A1 | 6/2006 | Nealey et al. |
| 2007/0092721 | A1 | 4/2007 | Kishimoto |
| 2007/0095469 | A1 | 5/2007 | Burdinski |
| 2008/0075978 | A1* | 3/2008 | Weller et al. ............... 428/826 |
| 2008/0233435 | A1 | 9/2008 | Hasegawa et al. |
| 2008/0257187 | A1 | 10/2008 | Millward |
| 2008/0299353 | A1 | 12/2008 | Stoykovich et al. |
| 2009/0087653 | A1 | 4/2009 | Nealey et al. |
| 2009/0087664 | A1 | 4/2009 | Nealey et al. |
| 2009/0260750 | A1 | 10/2009 | Nealey et al. |
| 2010/0255268 | A1 | 10/2010 | Choi et al. |
| 2010/0316849 | A1 | 12/2010 | Millward et al. |
| 2012/0164392 | A1 | 6/2012 | Stoykovich et al. |
| 2012/0189824 | A1 | 7/2012 | Nealey et al. |
| 2012/0202017 | A1 | 8/2012 | Nealey et al. |
| 2013/0189504 | A1 | 7/2013 | Nealey et al. |
| 2013/0230705 | A1 | 9/2013 | Nealey et al. |
| 2014/0010990 | A1 | 1/2014 | Nealey et al. |
| 2014/0065379 | A1 | 3/2014 | Nealey et al. |
| 2014/0087142 | A1 | 3/2014 | Nealey et al. |

FOREIGN PATENT DOCUMENTS

| | | |
|---|---|---|
| JP | 2004/099667 | 4/2004 |
| JP | 2005-502916 | 1/2005 |
| JP | 2005-502917 | 1/2005 |
| JP | 2007/125699 | 5/2007 |
| JP | 2007/138052 | 6/2007 |
| JP | 2007/313568 | 12/2007 |
| JP | 2011-080379 | 4/2011 |
| WO | 03/023517 | 3/2003 |
| WO | 2006112887 | 6/2006 |
| WO | 2007/111215 A | 10/2007 |
| WO | 2009/146068 | 12/2009 |
| WO | 2009/146086 | 12/2009 |

OTHER PUBLICATIONS

U.S. Appl. No. 11/580,694, filed Oct. 12, 2006, Nealey et al.
U.S. Appl. No. 11/879,758, filed Feb. 17, 2007, Nealey et al.
Asakawa et al. (2002) Nanopatterning with Microdomains of Block Copolymers using Reactive-Ion Etching Selectivity, *Jpn. J. Appl. Phys.*, vol. 41 (2002) pp. 6112-6118.
Bates et al. (1990) Block Copolymer Thermodynamics: Theory and Experiment, *Annu. Rev. Phys. Chem.*, 1990, 41: pp. 525-557.
Bates et al. (1995) Isotropic Lifshitz Behavior in Block Copolymer-Homopolymer Blends, *Phy. Rev. Ltrs.*, vol. 75, No. 24, Dec. 11, 1995.
Bates et al. (1997) Polymeric Bicontinuous Microemulsions, *Phy. Rev. Ltrs.*, vol. 69, No. 5, Aug. 4, 1997.
Bates, et al., "Block Copolymers—Designer Soft Materials," *Physics Today*, Feb. 1999, vol. 52, No. 2, pp. 32-38.
Berreman et al. (1990) Use of trilevel resists for high-resolution soft-x-ray projection lithography, *Appl. Phys. Ltr.* 56 (22), May 28, 1990, p. 2180.
Black et al. (2001) Integration of self-assembled diblock copolymers for semiconductor capacitor fabrication, *Applied Physics Letters*, vol. 79, No. 3, Jul. 16, 2001, pp. 409-411.
Black et al. (2004) High-Capacity, Self-Assembled Metal-Oxide-Semiconductor Decoupling Capacitors, *IEEE Electron Device Ltrs*, vol. 25, No. 9, Sep. 2004.
Black, C.T., et al, "Polymer Self Assembly in Semiconductor Microelectronics," IBM Journal of Research and Development, *International Business Machines Corporation*, New York, vol. 51, No. 5, Sep. 1, 2007, XP007905680, pp. 605-633.
Bohbot-Raviv, et al., "Discovering New Ordered Phases of Block Copolymers," *The American Physical Society*, vol. 85, No. 16, Oct. 16, 2000, 4 pages.
Boltau et al. (1998) Surface-induced structure formation of polymer blends on patterned substrates, *Nature*, vol. 391, Feb. 1998, p. 877.
Broseta et al. (1990) Phase equilibria in copolymer/homopolymer ternary blends: Molecular weight effects, *J. Chem. Phy.*, 93(4), Aug. 15, 1990.
Burgaz et al., "T-Junction Grain Boundaries in Block Copolymer-Homopolymer Blends," *Macromolecules*, vol. 33, pp. 8739-8745.
Campbell et al., "Fabrication of photonic crystals for the visible spectrum by holographic lithography," *Nature*, vol. 404, Mar. 2, 2000, p. 53.
Cardinale et al., "Demonstration of pattern transfer into sub-100 nm polysilicon line/space features patterned with extreme ultraviolet lithography," *J. Va. Sci. Technol. B* vol. 17(6), Nov./Dec. 1999.
Chan et al., "Ordered Bicontinuous Nanoporous and Nanorelief Ceramic Films from Self Assembling Polymer Precursors," *Science*, 286, 1716 (1999); DOI: 10.1126/science.386.5445.1716.
Chen et al., "Morphology of thin block copolymer films on chemically patterned substrates," *Journal of Chemical Physics*, Apr. 22, 1998, vol. 108, No. 16, p. 6897.
Cheng et al (2001) Formation of a Cobalt Magnetic Dot Array viz Block Copolymer Lithography, *Adv. Mater 2001*, 13, No. 15 Aug. 3, 2001, p. 1174-1178.
Cheng et al., "Fabrication of nanostructures with long-range order using block copolymer lithography," *Applied Physics Letters*, vol. 81, No. 19, Nov. 4, 2002, p. 3657-3659.
Cheng et al., "Templated Self-Assembly of Block Copolymers: Effect of Substrate Topography," *Advanced Materials* 2003, vol. 15, No. 19, Oct. 2, pp. 1599-1602.
Corvazier et al., "Lamellar phases and microemulsions in model ternary blends containing amphiphilic block copolymers," *The Royal Society of Chemistry, J. Mater. Chem.*, 2001, vol. 11, pp. 2864-2874.
Coulon et al., "Surface-Induced Orientation of Symmetric, Diblock Copolymers: A Secondary Ion Mass Spectrometry Study," *Macromolecules*, vol. 22, pp. 2581-2589.
Coulon et al., "Time Evolution of the Free Surface of Ultrathin Copolymer Films," *Macromolecules*, vol. 26, pp. 1582-1589.

(56) References Cited

OTHER PUBLICATIONS

Craig, et al., "Self Assembly of Block Copolymers on Lithographically Defined Nano Patterned Substrate," *Journal of Photopolymer Science & Technology*, vol. 20, No. 4, Jun. 4, 2007, 7 pages.

Daoulas et al., "Fabrication of Complex Three-Dimensional Nanostructures from Self-Assembling Block Copolymer Materials on Two-Dimensional Chemically Patterned Templates with Mismatched Symmetry," *Physical Review Letters*, Jan. 27, 2006, PRL 96, pp. 036104-1-036104-4.

Daoulas et al., "Morphology of multi-component polymer systems: single chain in mean field simulation studies," The Royal Society of Chemistry, *Soft Matter*, 2006, vol. 2, pp. 573-583.

Daoulas, et al., "Directed Assembly of Copolymer Materials on Patterned Substrates: Balance of Simple Symmetries in Complex Structures," *Journal of Polymer Science*, Copyright 2006, vol. 44, pp. 2589-2604.

Daoulas, et al., "Directed Copolymer Assembly on Chemical Substrate patterns: A Phenomenological and Single-Chain-in-Main-Field Simulations Study of the Influence of Roughness in the Substrate Pattern," *American Chemical Society*, Langmuir, published Dec. 8, 2007, vol. 24, pp. 1284-1295.

Detcheverry, et al., Monte Carlo Simulation of Coarse Grain Polymeric Systems, *The American Physical Society*, May 15, 2009, PRL 102(19) 197801(4), pp. 197801-1-197801-4.

Detcheverry, et al., "Theoretically Informed Coarse Grain Simulations of Block Copolymer Melts: Method and Applications," *Soft Matter*, 5 (24), 2008, 4868-4865.

Detcheverry, et al., "Stimulations of Theoretically Informed Coarse Grain Models of Polymeric Systems," *Faraday Discussions*, vol. 144, (2010) 111-125 (total 17 pages).

Detcheverry, et al., Monte Carlo Simulations of a Course Grain Model for Block Copolymers and Nanocomposites, published Jun. 11, 2008, vol. 41, pp. 4989-5001.

Düchs et al. (2003) Fluctuation Effects in Ternary AB+A+B Polymeric Emulsions, *Macromolecules* V36, pp. 9237-9248.

Düchs et al. (2004) Formation and structure of the microemulsion phase in two-dimensional ternary AB+A+B Polymeric emulsions, *J. of Chem. Phy.*, vol. 121, No. 6, Aug. 8, 2004, p. 2798.

Edwards, et al., Binary Blends of diblock Copolymers as an Effective route to Multiple, Length Scales in Perfect Directed Self-Assembly of Diblock Copolymer Thin Films, *J. Vac. Sci., Technol.*, vol. 24, No. 1, Jan./Feb. 2006, pp. 340-344.

Edwards et al. (2004) Precise Control over Molecular Dimensions of Block-Copolymer Domains Using the Interfacial Energy of Chemically Nanopatterned Substrates, *Advanced Materials*, 2004, vol. 16, No. 15, Aug. 4, pp. 1315-1319.

Edwards, E., et al., "Dimensions and Shapes of Block Copolymer Domains Assembled on Lithographically Defined Chemically Patterned Substrates," *Macromolecules*, vol. 40, Dec. 14, 2006, XP-002540679, pp. 90-96.

Edwards, et al., "Long-Range Order and Orientation of Cylinder-Forming Block Copolymers on Chemically Nanopatterned Striped Surfaces," *American Chemical Society*, Macromolecules, published Apr. 13, 2006, vol. 39, pp. 3598-3607.

Edwards, et al., "Mechanism and Kinetics of Ordering in Diblock Copolymer Thin Films on Chemically Nanopatterned Substrates," *Journal of Polymer Science*: Part B, Polymer Physics, 2005, vol. 43, pp. 3444-3459.

Ekinci, et al., "20 nm Line/Space Patterns in HSQ Fabricated by EUV Interference Lithography," Photon Lithography, MNE 2006 Micro- and Nano-Engineering, 2 pages.

Fasolka et al. (2000) Morphology of Ultrathin Supported Diblock Copolymer Films: Theory and Experiment, *Macromolecules* vol. 33, pp. 5702-5712.

Floudas et al. (1997) Microphase separation in block copolymer/homopolymer blends: Theory and experiment, *J. Chem. Phys.* 106 (8), Feb. 22, 1997, p. 3318.

Fukukawa et al. (2005) Synthesis and Characterization of Silicon-Containing Block Copolymers from Nitroside-Mediated Living Free Radical Polymerization, *Macromolecules* vol. 38, pp. 263-270.

Galatsis, K., et al., "Patterning and Templating for Nanoelectronics," *Advanced Materials*, 2010, vol. 22, pp. 769-778.

Han, et al., "Effect of Composition of Substrate-Modifying Random Copolymers on the Orientation of Symmetric and Asymmetric Diblock Copolymer Domains," *American Chemical Society*, Published Nov. 6, 2008, vol. 41, pp. 9090-9097.

Han, et al., Perpendicular Orientation of Domains in Cylinder-Forming Block Copolymer Thick Films by Controlled Interfacial Interactions, *American Chemical Society*, Macromolecules Article, Published Jun. 11, 2009, vol. 42, pp. 4896-4901.

Helfand et al. (1972) Theory of the Interface between Immiscible Polymers, II, *Journal of Chemical Physics*, vol. 56, No. 7, Apr. 1, 1972, pp. 3592-3601.

Hillmyer et al. (1991) Model Bicontinuous Microemulsions in Ternary Homopolymer/Block Copolymer Blends, *J. Phy. Chem.* B 1999, 103, pp. 4814-4824.

Hirai, et al., "One-Step Direct-Patterning Template Utilizing Self-Assembly of POSS-Containing Block Copolymers," *Adv. Mater.*, 2009, vol. 21, pp. 4334-4338.

Hong, A., et al., "Metal Nanodot Memory by Self-Assembled Block Copolymer Lift-Off," *American Chemical Society*, Nano Left 2010, vol. 10, pp. 224-229.

Huang et al. (1991) Modeling Copolymer Adsorption on Laterally Heterogeneous Surfaces, *Physical Review Letters*, Feb. 4, 1991, vol. 66, No. 5, p. 620.

In, et al., Side-Chain-Grafted Random Copolymer Brushes as Neutral Surfaces for Controlling the Orientation of Block Copolymer Microdomains in Thin Films, *American Chemical Society*, Langmuir, published Aug. 1, 2006, vol. 22, pp. 7855-7860.

Jeong et al., "Asymmetric Block Copolymers with Homopolymers: Routes to Multiple Length Scale nanostructures," *Adv. Mater.*, 2002, vol. 14, No. 4, Feb. 19, 2002, p. 274.

Jeong et al. (2003) Precise Control of Nanoporc Size in Thin Film Using Mixtures of Asymmetric Block Copolymer and Homopolymer, *Macromolecules* 2003, 36, pp. 10126-10129.

Ji, et al., "Generalization of the Use of Random Copolymers to Control the Wetting Behavior of Block Copolymer Films," American Chemical Society, published Nov. 11, 2008, vol. 41, pp. 9098-9103.

Ji, et al., "Preparation of Neutral Wetting Brushes for Block Copolymer Films from Homopolymer Blends," Advanced Materials, 2008 vol. 20, pp. 3054-3060.

Ji, et al., "Molecular Transfer Printing Using Block Copolymers," *ACS Nano* vol. 4, No. 2, 2010, pp. 599-609.

Kang, et al., "Control of the Critical Dimensions and Line Edge Roughness With Pre-Organized Block Copolymer Pixelated photoresists," *J. Vac. Sci. Technol.* vol. 27, No. 6, Nov./Dec. 2009, pp. 2993-2997.

Kang, et al., "Hierarchical Assembly of Nanoparticle Superstructures from Block Copolymer-Nanoparticle Composites," published Apr. 9, 2008, vol. 100(4), pp. 148303-1-148303-4.

Kang, et al., "Directed Assembly of Asymmetric Ternary Block Copolymer-Homopolymer Blends Using Symmetric Block Copolymer into Checkerboard Trimming Chemical Patterns," *J. Vac. Sci. Technol.*, vol. 26, No. 5, Nov./Dec. 2008, pp. 2495-2499.

Kim et al. (2000) Chemical Modification of Self-Assembled Monolayers by Exposure to Soft X-rays in Air, *J. Phys. Chem.*, vol. 104, No. 31, 2000, pp. 7403-7410.

Kim et al. (2003) Epitaxial self-assembly of block copolymers on lithographically defined nanopatterned substrates, *Nature*, vol. 424, Jul. 24, 2003, Nature Publishing Group, pp. 411-414.

Kim, et al., "Defect Structure in Thin Films of a Lamellar Block Copolymer Self-Assemble on Neutral Homogeneous and Chemically Nanopatterned Surfaces," American Chemical Society, *Macromolecules*, published Jul. 13, 2006, vol. 39, 5466-5470.

Kim, et al., "Synthesis of Photoacid Generator-Containing Patternable Diblock Copolymers by Reversible Addition—Fragmentation Transfer Polmerization," Chemistry of Materials, *American Chemical Society*, Jul. 6, 2009, pp. 3030-3032.

Krishnan et al. (2001) Shear-Induced Nano-Macro Structural Transition in a Polymeric Bicontinuous Microemulsion, *Phy. Rev. Ltrs.*, vol. 87, No. 9, Aug. 27, 2001, p. 098301-1.

La, et al., "Directed Assembly of Cylinder-Forming Block Copolymer Films and Thermochemically Induced Cylinder to Sphere Tran-

(56) References Cited

OTHER PUBLICATIONS sition: A Hierarchical Route to Linear Arrays of Nanodots," Nano Letter 2005, published May 28, 2005, *American Chemical Society*, vol. 5, No. 7, pp. 1379-1384.

La, et al, "Directed Assembly of Cylinder-Forming Block Copolymers into Patterned Structures to Fabricate Arrays of Spherical Domains and Nanoparticles," *Chemistry of Materials*, 2007:19(18), pp. 4538-4544.

Li et al. (2000) Dense arrays of ordered GaAs nanostructures by selective area growth on substrates patterned by block copolymer lithography, *Applied Physics Letters*, vol. 76, No. 13, Mar. 27, 2000, pp. 1689-1691.

Liu, et al., "Modification of a Polystyrene Brush Layer by Insertion of Poly(methyl methacrylate) Molecules," *J. Vac. Sci. Technol.*, vol. 27, No. 6, Nov./Dec. 2009 3038-3042.

Liu, et al., "Phase Behavior and Dimensional Scaling of Symmetric Block Copolymer—Homopolymer Ternary Blends in Thin Films," *American Chemical Society*, Macromolecules, vol. 42 Mar. 26, 2009, pp. 3063-3072.

Mansky et al. (1997) Ordered Diblock Copolymer Films on Random Copolymer Brushes, Macromolecules 1997, 30, pp. 6810-6813.

Mansky et al. (2006) Controlling Polymer-Surface Interactions with Random Copolymer Brushes, 1997, vol. 275, pp. 1458-1460.

Messe et al. (2003) Effect of the Molecular weight of the homopolymers on the morphology in ternary blends of polystyrene, polyisoprene, polystyrene-block-polyisoprene copolymer, *Polymer*, 44 (2003) pp. 7397-7403.

Morkved et al. (1999) Dynamics of ternary polymer blends: Disordered, ordered and bicontinouous microemulsion phases, *Faraday Discuss*, 1999, 112, pp. 335-350.

Morkved et al. (2001) Static and Dynamic Scattering from Ternary Polymer Blends: Bicontinuous Microemulsions, Lifshitz lines, and amphiphilicity, *J. of Chem. Phy.*, V.114, No. 16, Apr. 22, 2001, p. 7247.

Morin, et al., "Assembly of Nanocrystal Arrays by Block-Copolymer-Directed Nucleation," *Angew. Chem. Inc.*, Ed. 2009, vol. 48, pp. 2135-2139.

Mortensen et al. (2000) Ternary mixture of homopolymer blend and diblock copolymer studied near the Lifshitz composition by small-angle neutron scattering, *J. Appl. Cryst.*, 2000, 33, pp. 686-689.

Muller et al. (2005) Phase Separation in Binary Mixtures Containing Polymers: A Quantitative Comparison of Single-Chain-In-Mean-Field Simulations and Computer Simulations of the Corresponding Multichain Systems, *J. of Polymer Science: Part B: Polymer Physics*, vol. 43, pp. 934-958; published on-line in Wiley InterScience (www.interscience.wiley.com).

Naito et al. (2002) 2.5-Inch Disk Patterned Media Prepared by an Artificially Assisted Self-Assembling Method, *IEEE Trans. on Magnetics*, vol. 38, No. 5, Sep. 2002, p. 1949.

Nakano, et al., Single-Step Single-Molecule PCR of DNA with a Homo-Priming Sequence Using a Single Primer and Hot-Startable DNA Polymerase, *Journal of Bioscience and Bioengineering*, 2000, vol. 90 No. 4, pp. 456-458.

Nath, et al., "Density Functional Theory of Molecular Structure for Thin Diblock Copolymer Films on Chemically Heterogeneous Surfaces," *Journal of Chemical Physics*, vol. 110 No. 15, Apr. 15, 1999, pp. 7483-7490.

Orso et al. (1999) Phase Behavior of Thin Film Blends of Block Copolymers and Homopolymers: Changes in Domain Dimensions, *Macromolecules*, 32, pp. 1087-1092.

Park et al. (1997) Block Copolymer Lithography: Periodic Arrays of ~$10^{11}$ Holes in 1 Square Centimeter, *Science*, vol. 276, May 30, 1997, pp. 1401-1404.

Park et al. (2003) Enabling nanotechnology with self assembled block copolymer patterns, *Polymer*, vol. 44 (2003) pp. 6725-6760; www.sciencedirect.com.

Park, et al., "Characterization of Cylinder-Forming Block Copolymers Directed to Assemble on Spotted Chemical Patterns," *American Chemical Society, Macromolecules*, Published Nov. 4, 2008, vol. 41, No. 23, pp. 9118-9123.

Park, et al., "Combinatorial Generation and Replication-Directed Assembly of Complex and Varied Geometries with Thin Films of Diblock Copolymers," *American Chemical Society*, Langmuri, published Jul. 24, 2007, vol. 23, pp. 9037-9045.

Park, et al., "Controlled growth of InGaAs/InGaAsP Quantum Dots on InP Substrates Employing Diblock Copolymer Lithography," *American Institute of Physics*, Allied Physics Letters 95, 2009, pp. 113111-1 to 113111-3.

Park, et al., "Selective Growth and Characterization of InGaAs Quantum Dots on Patterned InP Substrates Utilizing a Diblock Copolymer Template," *IEEE* 978-4244-3433-6/09, copyright 2009, pp. 52-54.

Park, et al., "Square Arrays of Vertical Cylinders of PS-b-PMMA on Chemically Nanopatterned Surfaces," *American Chemical Society*, Macromolecules, published Jul. 15, 2007, vol. 40, pp. 5084-5094.

Park, Sang-Min, "Morphological Reconstruction and Ordering in Films of Sphere-Forming Block Copolymers on Striped Chemically Patterned Surfaces," *American Chemical Society*, published Nov. 4, 2008, vol. 41, pp. 9124-9129.

Park, et al., "Nano-Scale Selective Growth and Optical Characteristics of Quantum Dots on III-V Substrates Prepared by Diblock Copolymer Nano-Patterning," *Journal of Nanophotonics*, 3 (1), 031604, Jan. 30, 2009, pp. 1-12.

Pereira et al. (1998) Diblock Copolymer Thin Films on Heterogeneous Striped Surfaces: Commensurate, Incommensurate and inverted Lamellae, *Physical Review Letters*, vol. 80, No. 13, Mar. 30, 1998, p. 2849.

Peters et al. (2000) Using Self-Assembled Monolayers Exposed to X-rays to Control the Wetting Behavior of Thin Films of Diblock Copolymers, *Langmuir*, vol. 16, No. 10, 2000, pp. 4625-4631.

Peters, et al., A Near Edge X-ray Absorption Fine Structure Spectroscopy Investigation of the Structure of Self Assembled Films of Octadecyltrichlorosilane, *American Chemical Society*, Langmuir, published Jan. 24, 2002, vol. 18, pp. 1250-1256.

Peters, et al., "Combining Advanced Lithographic Techniques and Self-Assembly of Thin Films of Diblock Copolymers to Produce Templates for Nanofabrication," *J. Vac. Sci. Technol.*, vol. 18(6), Nov./Dec. 2000, pp. 3530-3534.

Peters, et al., "Morphology of Thin Films of Diblock Copolymers on Surfaces Micropatterned with Regions of Different Interfacial Energy," *American Chemical Society*, Macromolecules, published Jan. 26, 2002, vol. 35, pp. 1822-1834.

Peters, et al., "Wetting Behavior of Block Copolymers on Self Assembled Films of Alkylchlorosiloxanes: Effect of Grafting Density," *American Chemical Society*, Langmuir, published Oct. 21, 2000, vol. 16, pp. 9620-9626.

Pike, et al., "Theoretically Informed Coarse Grain Simulations of Polymeric Systems," *The Journal of Chemical Physics*, Published Aug. 27, 2009, vol. 131, pp. 084903-1to 084903-10.

Preliminary Examination Report dated May 30, 2007 issued in WO2006112887.

Rockford et al. (1999) Polymers on Nanoperiodic, Heterogeneous Surfaces, *Phy. Rev. Ltrs., The American Physical Society*, vol. 82, No. 12, pp. 2602-2605.

Ruiz, et al., "Density Multiplication and Improved Lithography by Directed block Copolymer Assembly," Science, vol. 321, Aug. 15, 2008, pp. 936-939.

Russell et al. (1989) Characteristics of the Surface-Induced Orientation for Symmetric Diblock PS/PMMA Copolymers, *Macromolecules*, vol. 22, pp. 4600-4606.

Schattenburg et al. (1995) Optically matched trilevel resist process for nanostructure fabrication, *J. Vac. Sci. Technol. B*, 15(6), Nov./Dec. 1995, p. 3007.

Schwahn et al. (1999) Crossover from 3D Ising to Isotropic Lifshitz Critical Behavior in a Mixture of a Homopolymer Blend and Diblock Copolymer, *Phy. Rev. Ltrs., The American Physical Society*, vol. 82, No. 25, Jun. 21, 1999, p. 5056.

Schwahn et al., "Thermal Composition fluctuations near the isotropic Lifshitz critical point in a ternary mixture of a homopolymer blend and diblock copolymer," *J. Chem. Phy.*, vol. 112 , No. 12, Mar. 22, 2000, p. 5454.

Solak, et al., "Sub-50 nm Period Patterns With EUV Interference Lithography," *Microelectronic Engineering* 67-68 (2003) 56-62.

(56) References Cited

OTHER PUBLICATIONS

Solak, Harun H., "Nanolithography with coherent extreme ultraviolet light," *J. of Physics D: App. Phys.*, 39 (2006) R171-R188.
Son, et al., "Placement Control of Nanomaterial Arrays on the Surface-Reconstructed Block Copolymer Thin Films," *ACSNano*, vol. 3, No. 12, 2009, pp. 3927-3934.
Son, et al., "Surfactant-Assisted Orientation of Thin Diblock Copolymer films," *Advanced Materials*, 2008, vol. 20, pp. 3643-3648.
Stoykovich et al. (2005) Directed Assembly of Block Copolymer Blends into Nonregular Device-Oriented Structures, *Science*, vol. 308, No. 5727, Jun. 3, 2005, www.sciencemag.org, pp. 1442-1446.
Stoykovich et al. (2006) Phase Behavior of Symmetric Ternary Block Copolymer-Homopolymer Blends in Thin Films and on Chemically Patterned Surfaces, *Physical Review Letters*, Oct. 6, 2006, PRL 97, 147802 (2006).
Stoykovich, M.P., et al, "Block Copolymers and Conventional Lithography," *Materials Today*, Elsevier Science, Kidlington, GB, vol. 9, No. 9, Sep. 1, 2006, pp. 20-29.
Stoykovich, M.P., et al, "Remediation of Line Edge Roughness in Chemical Nanopatterns by the Directed Assembly of Overlying Block Copolymer Films," Macromolecules, *American Chemical Society*, vol. 43, Feb. 10, 2010, pp. 2334-2342.
Stoykovich, Mark P., et al., "Methods and Compositions for Forming Patterns With Isolated or Discrete Features Using Block Copolymer Materials," U.S. Appl. No. 11/879,758, filed Jul. 17, 2007.
Stuen, et al., In situ Characterization of Block Copolymer Ordering on Chemically Nanopatterned Surfaces by time-resolved small angle X-ray Scattering, *J. Vac. Sci. Technol.* vol. 26(6), published Dec. 1, 2008, pp. 2504-2508.
Stuen, K., et al., "Dimensional Scaling of Cylinders in Thin Films of Block Copolymer-Homopolymer Ternary Blends," *Am. Chem. Society*, Macromolecules Jun. 25, 2009, vol. 42, pp. 5139-5145.
Stuen, K., et al., "Imaging Layers for the Directed Assembly of Block Copolymer Films: Dependence of the Physical and Chemical Properties of Patterned Polymer Brushes on Brush Molecular Weight," *Journal of Vacuum Science and Technology*, Part B, AVS/ATP, Melville, New York, vol. 25, No. 6, Dec. 6, 2007, pp. 1958-1962.
Suh, Hyo Seon, et al., "Orientation of Block Copolymer Resists on Interlayer Dielectrics with Tunable Surface Energy," *American Chemical Society*, vol. 43, Nov. 13, 2009, pp. 461-466.
Teubner et al. (1987) Origin of the Scattering Peak in Microemulsions, *J. Chem. Phys.*, 87(5), Sep. 1, 1997, p. 3195.
Thurn-Albrecht et al. (2000) Nanoscopic Templates from Oriented Block Copolymer Films, Communications, *Advanced Materials*, vol. 12, No. 11, pp. 787-791.
Thurn-Albrecht et al. (2000) Ultrahigh-Density Nanowire Arrays Grown in Self-Assembled Diblock Copolymer Templates, *Science*, Dec. 15, 2000, vol. 290, pp. 2126-2129.
Ting, et al., "Plasma Etch Removal of Poly (methyl methacrylate) in Block Copolymer Lithography," *J. Vac. Sci. Technol.*, vol. 26(5), Sep./Oct. 2008, pp. 1684-1689.
Torikai et al. (1997) Lamellar Domain Spacings of Diblock Copolymer/Homopolymer Blends and Conformations of Block Chains in Their Microdomains, *Macromolecules*, 30, pp. 5698-5703.
Urbas et al. (2000) Tunable Block Copolymer/Homopolymer Photonic Crystals, *Advanced Materials*, vol. 12, No. 11 p. 812.
Urbas et al. (2002) Bicontinuous Cubic Block Copolymer Photonic Crystals, *Advanced Materials*, vol. 14, No. 24, Dec. 17, 2002, p. 1850.
Wang et al. (2000) Symmetric diblock copolymer thin films confined between homogeneous and patterned surfaces: Simulations and theory, *Journal of Chemical Physics*, vol. 112, No. 22, Jun. 8, 2000, pp. 9996-10010.
Wang, et al., Behavior of Single Nanoparticle/ Homopolymer Chain in Ordered Structures of Diblock Copolymers, *Journal of Chemical Physics*, Jun. 22, 2003, vol. 118, No. 24, pp. 11278-11285.
Wang, et al., "Lamellar Structures of Symmetric Diblock Copolymers: Comparisons Between Lattice Monte Carlo Simulations and Self-Consistent Mean-Field Calculations," *American Chemical Society*, Macromolecules, published Nov. 8, 2002, vol. 35, pp. 9563-9573.
Wang, et al., "Monte Carlo Simulations of Asymmetric Diblock Copolymer Thin Films Confined Between two Homogeneous Surfaces," *American Chemical Society*, Macromolecules, published Apr. 6, 2001, vol. 34, pp. 3458-3470.
Wang, et al., "Simulations of the Morphology of Cylinder-Forming Asymmetric Diblock Copolymer Thin Films on Nanopatterned Substrates," *American Chemical Society*, Macromolecules published Feb. 7, 2003, vol. 36, pp. 1731-1740.
Wang, et al., Monte Carlo Simulations of Diblock Copolymer Thin Films Confined Between Chemically Heterogeneous Hard Surfaces, *American Chemical Society*, Macromolecules, published May 17, 2000, vol. 33, pp. 4512-4525.
Wang, et al., Monte Carlo Simulations of Diblock Copolymer Thin Films Confined Between two Homogeneous Surfaces, *Journal of Chemical Physics*, Jan. 1, 2000, 112(1): 450-464.
Welander, et al., "Impact of Trench Width Roughness on the Graphoepitaxial Assembly of Block Copolymers," *J. Vac. Sci. Technol.*, vol. 26(6), Nov./Dec. 2008, pp. 2484-2489.
Welander, et al., "Rapid Directed Assembly of Block Copolymer Films at Elevated Temperatures," *American Chemical Society*, Macromolecules, vol. 41, Published Apr. 1, 2008, pp. 2759-2761.
Whitesides et al. (1991) Molecular self-Assembly and Nanochemistry: A Chemical Strategy for the Synthesis of Nanostructures, Articles, *Science* vol. 254, p. 1312, Nov. 29, 1991.
Whitesides et al. (2002) Self-Assembly at All Scales, *Science, AAAS*, 295, p. 2418.
Xiao, et al., "Graphoepitaxy of Cylinder-forming Block Copolymers for Use as Templates to Pattern Magnetic Metal Dot Arrays," Institute of Physics Publishing, *Nanotechnology*, vol. 16, No. 7, 2005, pp. S324-S329.
Xu et al. (2001) The Influence of molecular weight on nanoporous polymer films, *Polymer*, 42 (2001) pp. 9091-9095; www.elsevier.com/locate/polymer.
Yang et al. (2000) Guided Self-Assembly of Symmetric Diblock Copolymer Films on Chemically Nanopatterned Substrates, *Macromolecules 2000*, 33, pp. 9575-9582.
Yang et al., "Imaging the Substrate Film Interface of Thin Films of Diblock Copolymers on Chemically Patterned Surfaces," *American Chemical Society*, Macromolecules, published Feb. 16, 2002, vol. 35, pp. 2406-2409.
Yang, et al., "Patterning of Self-Assembled Monolayers with Lateral Dimensions of 0.15 um Using Advanced Lithography," *J. Vac. Sci. Technol.*, vol. 17(6), Nov./Dec. 1999, pp. 3203-3207.
Yang, et al., "Proximity X-ray Lithography Using Self-Assembled Alkylsiloxane Films: Resolution and Pattern Transfer," *American Chemical Society*, Langmuir, published Dec. 8, 2000, vol. 17, 228-233.
Nealey, Paul Franklin, et al., "Density Multiplication and Improved Lithography by Directed Block Copolymer Assembly," U.S. Appl. No. 12/329,484, filed Dec. 5, 2008.
International Search Report and Written Opinion of the International Searching Authority mailed Aug. 24, 2009, Application No. PCT/US2008/085742, 14 pages.
Nealey, Paul Franklin, et al., "Molecular Transfer Printing Using Block Copolymers," U.S. Appl. No. 12/416,816, filed Apr. 1, 2009.
International Search Report and Written Opinion of the International Searching Authority mailed Dec. 16, 2009, Application No. PCT/US2009/039208.
Nealey, Paul Franklin, et al., "Methods and Compositions for Forming a Periodic Patterned Copolymer Films," U.S. Appl. No. 11/286,260, filed Nov. 22, 2005.
U.S. Office Action mailed Jul. 31, 2009, from U.S. Appl. No. 11/286,260.
U.S. Office Action mailed Jan. 25, 2010, from U.S. Appl. No. 11/286,260.
International Search Report and Written Opinion dated May 2, 2007 issued in WO2006112887.

(56) References Cited

OTHER PUBLICATIONS

Nealey, Paul Franklin, "Fabrication of Complex Three-Dimensional Structures Based on Directed Assembly of Self-Assembling Materials on Activated Two-Dimensional Templates," U.S. Appl. No. 11/545,060, filed Oct. 5, 2006.
U.S. Office Action mailed Apr. 3, 2009, from U.S. Appl. No. 11/545,060.
U.S. Office Action mailed Nov. 30, 2009, from U.S. Appl. No. 11/545,060.
Nealey, Paul Franklin, "Directed Assembly of Triblock Copolymers," U.S. Appl. No. 11/580,694, filed Oct. 12, 2006.
U.S. Office Action mailed Dec. 2, 2009, from U.S. Appl. No. 11/580,694.
U.S. Office Action mailed Jul. 23, 2009, from U.S. Appl. No. 11/545,060.
U.S. Final Office Action mailed Mar. 8, 2010, from U.S. Appl. No. 11/545,060.
U.S. Office Action mailed Jun. 25, 2010, from U.S. Appl. No. 11/286,260.
U.S. Office Action mailed Jul. 12, 2010, from U.S. Appl. No. 11/545,060.
U.S. Final Office Action mailed Jun. 10, 2010, from U.S. Appl. No. 11/580,694.
Todo et al., "Domain-Boundary Structure of Styrene-Isoprene Block Copolymer Films Cast From Solutions .III. Preliminary-Results on Spherical Microdomains," *Polymer Engineering and Science*, 17 (8): 587-597 1977.
Morkved et al., "Local control of microdomain orientation in diblock copolymer thin films with electric fields," *Science*, 273 (5277): 931-933 Aug. 16, 1996, pp. 931-933.
Kim, S.H., et al., "Highly oriented and ordered arrays from block copolymers via solvent evaporation," *Advanced Materials*, Feb. 3, 2004, 16 (3), pp. 226-231.
Fasolka, MJ, et al., Block copolymer thin films: Physics and applications, *Annual Review of Materials Research*, 2001, 31, pp. 323-355.
Tanaka, H, et al., "Ordered Structure in Mixtures of a Block Copolymer and Homopolymers . 1. Solubilization of Low-Molecular-Weight Homopolymers," *Macromolecules*, 24 (1), Jan. 7, 1991, pp. 240-251.
Hamley, et al., Nanostructure fabrication using block copolymers, *Nanotechnology*, Oct. 2003, 14 (10), pp. R39-R54.
Segalman, RA, et al., "Graphoepitaxy of spherical domain block copolymer films," *Advanced Materials*, Aug. 3, 2001, 13 (15) pp. 1152-1155.
U.S. Final Office Action mailed Dec. 27, 2010, from U.S. Appl. No. 11/545,060.
Office Action mailed Oct. 7, 2010 for U.S. Appl. No. 12/416,816.
U.S. Final Office Action mailed Dec. 13, 2010, from U.S. Appl. No. 11/286,260.
U.S. Office Action mailed Mar. 15, 2011, from U.S. Appl. No. 11/545,060.
U.S. Office Action mailed Dec. 17, 2010, from U.S. Appl. No. 11/545,060.
Office Action mailed Apr. 20, 2011 for U.S. Appl. No. 12/416,816.
Watanabe, et al., "Smart Block Copolymer Masks With Molecule-Transport Channels for Total Wet Nanopatterning," *J. Mater. Chem*, 2008, vol. 18, 5482-5491.
Final Office action mailed Jul. 8, 2011, U.S. Appl. No. 11/879,758.
Office Action mailed Aug. 31, 2011 for U.S. Appl. No. 12/416,816.
Final Office Action mailed Sep. 1, 2011, from U.S. Appl. No. 11/545,060.
Supplemental EuropeanSearch Report mailed Oct. 26, 2011, from U.S. Application No. 05857837.8.
Notice of Allowance mailed Nov. 2, 2011 for U.S. Appl. No. 12/416,816.
Allowed Claims as of Nov. 2, 2011 for U.S. Appl. No. 12/416,816.
Notice of Allowance mailed Nov. 4, 2011 for U.S. Appl. No. 11/879,758.
Allowed Claims as of Nov. 4, 2011 for U.S. Appl. No. 11/879,758.
Notice of Allowance mailed Dec. 21, 2011, for U.S. Appl. No. 11/545,060.
Allowed Claims as of Dec. 21, 2011, for U.S. Appl. No. 11/545,060.
Stoykovich, et al., "Methods and Compositions for Forming Patterns With Isolated or Discrete Features Using Block Copolymer Materials," filed Feb. 3, 2012, U.S. Appl. No. 13/366,134.
Nealey, Paul Franklin, "Fabrication of Complex Three-Dimensional Structures Based on Directed Assembly of Self-Assembling Materials on Activated Two-Dimensional Templates," U.S. Appl. No. 13/436,341, filed Mar. 30, 2012.
Nealey, Paul Franklin, "Solvent Annealing Block Copolymers on Patterned Substrates," U.S. Appl. No. 13/367,337, filed Feb. 6, 2012.
Japanese Office Action mailed Jul. 3, 2012 , Application No. 2007-543480.
Nealey, Paul Franklin, "Improved Patterning in the Directed Assembly of Block Copolymers Using Triblock or Multi-Block Copolymers," U.S. Appl. No. 13/543,667, filed Jul. 6, 2012.
Office Action mailed Aug. 15, 2012 for U.S. Appl. No. 13/436,34.
Facsko, et al., "Formation of Ordered Nanoscale Semiconductor Dots by Ion Sputtering," Science, vol. 285, Sep. 3, 1999 pp. 1551-1553.
Japanese Office Action mailed Jul. 3, 2012, Application No. 2007-543480.
Office Action mailed Aug. 15, 2012 for U.S. Appl. No. 13/436,341.
Facsko, et al., Formation of Ordered Nanoscale Semiconductor Dots by Ion Sputtering, Science, vol. 285, Sep. 3, 1999 pp. 1551-1553.
Kim, S., et al, "Decoupling Bulk Thermodynamics and Wetting Characteristics of Block Copolymer Thin Films," ACS Macro Lett., American Chemical Society, pp. 11-14.
Notice of Allowance mailed Jun. 7, 2012, for U.S. Appl. No. 11/286,260.
U.S. Office Action mailed Oct. 15, 2012, from U.S. Appl. No. 11/580,694.
U.S. Office Action mailed Sep. 24, 2012, from U.S. Appl. No. 13/366,134.
Notice of Allowance mailed Apr. 5, 2012, from U.S. Appl. No. 13/366,134.
Ho, Chih-Shing, "Precision of Digital Vision Systems," IEEE Transaction on Pattern Analysis and Machine Intelligence, vol. PAMI-5, No. 6, Nov. 1983, pp. 593-601.
Nealey, Paul Franklin, et al. "Directed Assembly of Block Copolymer Films Between a Chemically Patterned Surface and a Second Surface," U.S. Appl. No. 13/619,525, filed Sep. 14, 2012.
International Search Report and Written Opinion mailed Dec. 5, 2012.
Nealey, Paul Franklin, et al. "Directed Assembly of Block Copolymer Films Between a Chemically Patterned Surface and a Second Surface," U.S. Appl. No. 13/543,681, filed Jul. 6, 2012.
Nealey, Paul Franklin, et al. "Topcoat Surfaces for Directing the Assembly of Block Copolymer Films on Chemically Patterned Surfaces," U.S. Appl. No. 13/601,460, filed Aug. 31, 2012.
Final Office Action mailed May 31, 2013, from U.S. Appl. No. 11/580,694.
Notice of Allowance mailed Sep. 6, 2013, from U.S. Appl. No. 11/580,694.
Notification of Reasons for Rejection dated Jul. 3, 2012 for Application No. 2007-543480.
Notice of Allowance mailed Sep. 5, 2013 for U.S. Appl. No. 13/436,341.
Nealey, Paul Franklin, "Fabrication of Complex Three-Dimensional Structures Based on Directed Assembly of Self-Assembling Materials on Activated Two-Dimensional Templates," U.S. Appl. No. 14/092,551, filed Nov. 27, 2013.
International Search Report and Written Opinion mailed on Nov. 26, 2013, issued in Application No. PCT /US2013/056792.
Office Action mailed Nov. 24, 2014, for U.S. Appl. No. 13/367,337.
Hanley, et al., Phase Behavior of a Block Copolymer in Solvents of Varying Selectivity, *Macromolecules* Jul. 7, 2000, vol. 33, pp. 5918-5931.
Ho et al., "Solvent-induced microdomain orientation in polystyrene-b-poly(L-lactide) diblock copolymer thin films for nanopatterning," Polymer, vol. 46, (2005), pp. 9362-9377.

(56) References Cited

OTHER PUBLICATIONS

Kim, et al., "Highly Oriented and ordered Arrays from Block Copolymers Via Solvent Evaporation," Adv. Mater., vol. 16, No. 3, Feb. 3, 2004, pp. 226-231.

Kim, et al., "Solvent-Induced Ordering in Thin Film Diblock Copolymer/Homopolymer Mixtures," Adv. Mater., vol. 16, No. 23-24, Dec. 17, 2004, pp. 2119-2123.

Kim, et al., Morphological Development in Solvent-Cast Polystyrene-Polybutadiene-Polystyrene (SBS) Triblock Copolymer Thin Films, Macromolecules, vol. 31, Mar. 31, 1998, pp. 2369-2577.

Lin, et al., "A Rapid Route to Arrays of Nanostructures in Thin Films," Adv. Mater., vol. 14, No. 19, Oct. 2, 2002, pp. 1373-1376.

Lodge, et al., "Phase Behavior of Block Copolymers in a Neutral Solvent," Macromolecules, vol. 36, No. 3, Jan. 3, 2003, pp. 816-822.

Mori, et al, "Order-disorder transition of polystyrene-block-polyisoprene Part II. Characteristic length as a function of polymer concentration, molecular weight, copolymer composition, and x parameter," Polymer, vol. 42, 2001, pp. 3009-3021.

Shibayama, et al., Ordered Structure in Block Polymer Solutions. 3. Concentration Dependence of Microdomains in Nonselective Solvents, J. Am. Chem. Soc., Vo. 16, 1983, pp. 1427-1433.

Sidorenko, et al., "Ordered Reactive Nanomembranes/Nanotemplates from Thin Films of Block Copolymer Supramolecular Assembly," J. Am. Chem. Soc., vol. 125, 2003, pp. 1221-12216.

Office Action mailed Mar. 25, 2015, for U.S. Appl. No. 13/619,525.

Feng, et al., "Monte Carlo Simulation of Triblock Copolymer thin Films," Polymer, vol. 43, Jul. 6, 2002, pp. 5775-5790.

Ramirez-Hernandez, A, et al., "Symmetric Diblock Copolymers Confined by Two Nanopatterned Surfaces," Department of Chemical and Biological Engineering, University of Wisconsin-Madison, Madison, Wisconsin 53706, Sep. 6, 2011, 10 pages.

Terris, et al., "Nanofabricated and self-assembled magnetic structures as data storage media," Journal of Physics D Applied Physics, vol. 38, 2005, pp. R199-R222.

Terris, et al., "Patterned media for future magnetic data storage," Microsystem Technologies, vol. 13, Issue 2, 2007, pp. 189-196.

* cited by examiner

Spheres 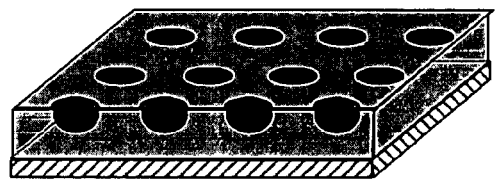
⊥ Cylinders 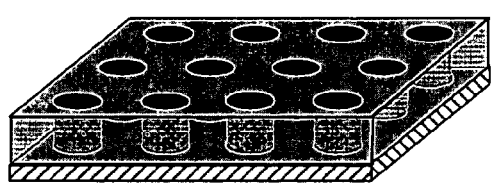
|| Cylinders 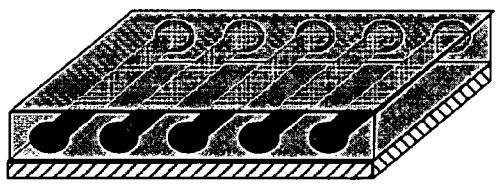
Lamellae 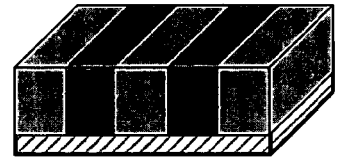
*FIG. 2*

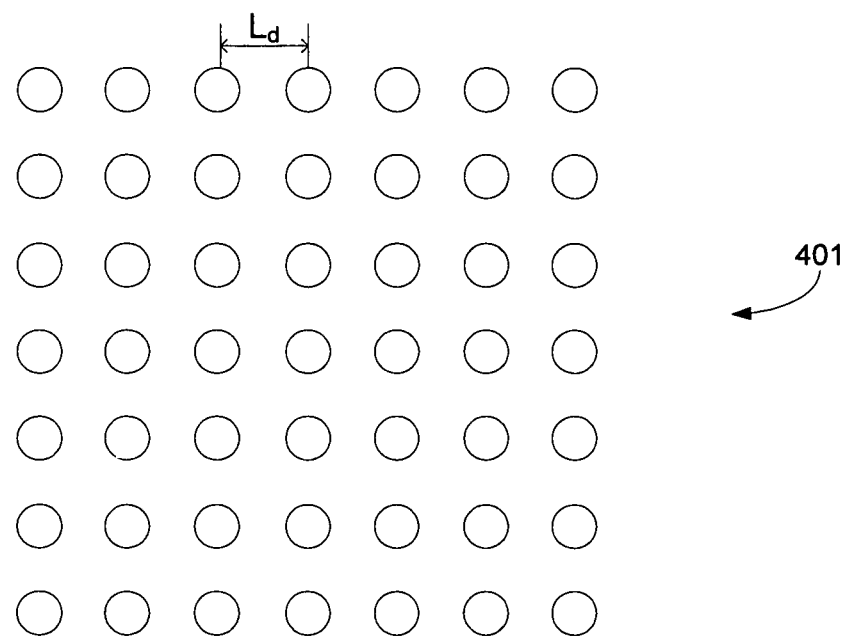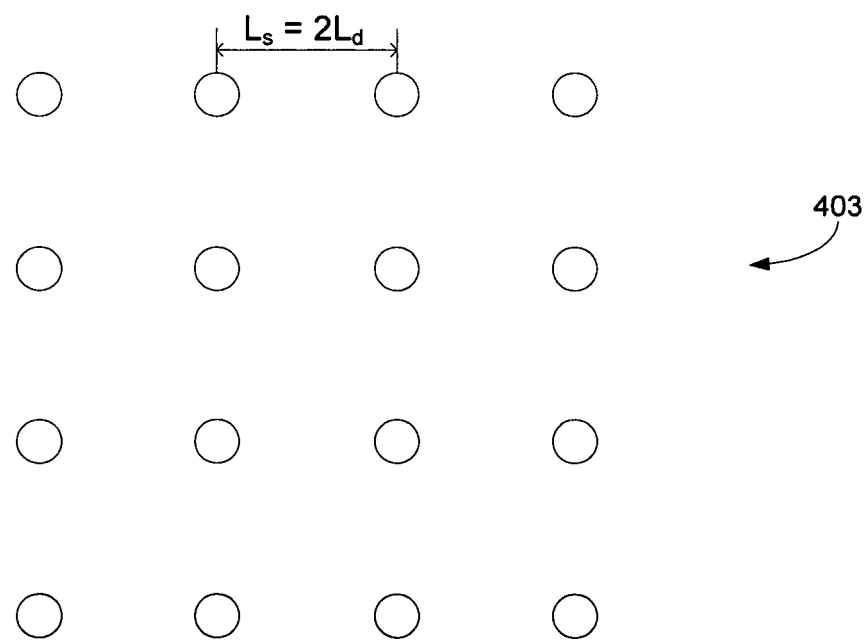
FIG. 4A

DENSITY MULTIPLICATION AND IMPROVED LITHOGRAPHY BY DIRECTED BLOCK COPOLYMER ASSEMBLY

CROSS-REFERENCE TO RELATED APPLICATIONS

This application claims benefit under 35 U.S.C. 119(e) of the following U.S. Provisional Applications: U.S. Provisional Application No. 61/005,721, filed Dec. 7, 2007; U.S. Provisional Application No. 61/068,912, filed Mar. 10, 2008; and U.S. Provisional Application No. 61/189,085, filed Aug. 15, 2008. All of these applications are incorporated by reference herein in their entireties and for all purposes.

BACKGROUND OF THE INVENTION

As the development of nanoscale mechanical, electrical, chemical and biological devices and systems increases, new processes are needed to fabricate nanoscale devices and components. This is especially true as the scale of these structures decreases to the tens of nanometers and below. The creation and replication of patterns is a key operation in the fabrication process. For example, in chip fabrication, optical lithography tools may be used to print the circuit patterns. However, optical lithography is prohibitively expensive as length scales decrease, and may reach technological impasses at about 30 nanometers and below.

SUMMARY OF THE INVENTION

Methods to pattern substrates with dense periodic nanostructures that combine top-down patterning tools and self-assembling block copolymer materials are provided. According to various embodiments, the methods involve chemically patterning a substrate, depositing a block copolymer film on the chemically patterned substrate, and allowing the block copolymer to self-assemble in the presence of the chemically patterned substrate, thereby producing a pattern in the block copolymer film that is improved over the substrate pattern in terms pattern feature size, shape, and uniformity, as well as regular spacing between arrays of features and between the features within each array as compared to the substrate pattern. In certain embodiments, the density and total number of pattern features in the block copolymer film is also increased as compared to the substrate pattern. High density and quality nanoimprint templates and other nanopatterned structures are also provided.

Aspects of the invention relate to methods of enhancing the performance of top-down lithographic materials, including healing defects in lithographic patterns and providing sublithographic patterning with a high degree of perfection and registration. Specific applications include fabricating patterned media for magnetic recording.

One aspect of the invention relates to a method of forming dense periodic patterns by rectifying a first pattern, the method involving selecting an ideal periodic pattern to be formed on a substrate; forming a first pattern on the substrate, wherein said first pattern has pattern features defined by activated regions on the substrate; depositing a block copolymer material on the first pattern; ordering the block copolymer material to form a second pattern having pattern features defined by microphase-separated domains of the block copolymer material, wherein the features of the second pattern are registered with the substrate and wherein the feature placement error of the second pattern is less than that of the first pattern. According to certain embodiments, the feature placement error is the difference in feature placement of the pattern from the ideal periodic placement.

According to various embodiments the standard deviation σ of feature placement of the second pattern from the ideal periodic pattern is no more than about 1 nm. In certain embodiments, the standard deviation σ of feature placement of the second pattern from the ideal pattern is no more than about 5% or 2% of the pitch of the ideal pattern.

In certain embodiments, the first pattern and second pattern have approximately the same feature density. The features of first pattern may correspond to a subset of features of the ideal pattern. In certain embodiment, the ideal pattern is a 2-dimensional array of dots and the standard deviation of the feature placement of the second pattern from the ideal pattern is no more than about 1 nm or 5%. In a particular embodiment, the ideal pattern is a hexagonal array of dots and the standard deviation of the feature placement of the second pattern from the ideal pattern is no more than about 1 nm or 5%. As discussed further below, in certain embodiments, the ideal pattern is made up of one or more circular tracks of dots, where the dots within each track have a constant angular pitch.

In certain embodiments, each feature has a top surface having a top surface area, and the size distribution of the top surface areas of the second pattern is narrower than the size distribution of the top surface areas of the first pattern. The standard deviation of the size distribution of the top surface areas of the second pattern may be no more than about 5% of the mean feature size of the second pattern.

Another aspect of the invention relates to a method of forming dense periodic patterns by increasing the density of a first pattern. The method involves forming a first pattern on a substrate, wherein said first pattern comprises pattern features defined by activated regions on the substrate; depositing a block copolymer material on the first pattern; ordering the block copolymer material to form a second pattern comprising pattern features defined by microphase-separated domains of the block copolymer material, wherein the features of the second pattern are registered with the substrate and wherein the feature density of the second pattern is greater than that of the first pattern.

According to various embodiments, for any of the methods described above, the ratio of the feature density of the second pattern to the feature density of the first pattern is at least 2:1, at least 4:1, or at least 9:1. In certain embodiments, the ratio is X:1, where X is greater than 1. The first substrate may be a periodic pattern or an aperiodic pattern.

For any of the methods described above, in certain embodiments, forming the first pattern on the substrate involves forming the first pattern in a thin film deposited on the substrate. The film may be a self-assembled monolayer or a polymer brush according to carious embodiments. The thin film may have a preferential affinity for a component polymer of the block copolymer material (over one or more other components polymers) or it may have about equal affinities to each of the component polymers of the block copolymer material. Forming the first pattern on the substrate may involve e-beam exposure of a resist coating disposed on top of a thin film to form an e-beam pattern, developing the e-beam pattern and locally modifying chemical properties of the thin film by exposing the thin film through open regions of the developed e-beam pattern to a modification agent.

In certain embodiments, the methods further involve transferring the second pattern to a media disk for magnetic recording. The features of the first pattern may include any of discrete spots on the substrate and stripes or lines. The second pattern features may include any of cylinders oriented perpendicular to the substrate or lamellae oriented perpendicular to the substrate.

A further aspect of the invention relates to nanoimprint templates that have a template body having first or second opposed sides; a first pattern disposed on said first side, said pattern including recessed or raised periodic features; wherein the density of said features is greater than about 1 tera-feature per square inch. According to various embodiments, the density is greater than about 2 tera-features per square inch, 3 tera-features per square inch, 4 tera-features per square inch, 5 tera-features per square inch, 6 tera-features per square inch, 7 tera-features per square inch, 8 tera-features per square inch, 9 tera-features per square inch, 10 tera-features per square inch or higher.

Yet another aspect of the invention relates to patterned media disks and other nanopatterned structures. According to various embodiments, such a disk or structure has first or second opposed sides; a first pattern disposed on said first side, said pattern comprising recessed or raised periodic features; wherein the density of said features is greater than about 1 tera-feature per square inch. For certain embodiments requiring circular symmetry, the ideal pattern is accommodated (or distorted) into circular tracks grouped in zones wherein each zone, the angular pitch is constant. An even further aspect of the invention relates to magnetic disk drives and disk drive systems. According to various embodiments, such a drive or system may include a patterned media disk including a disk having first or second opposed sides; a first pattern disposed on said first side, said pattern comprising recessed or raised periodic features; wherein the density of said features is greater than about 1 tera-feature per square inch; a hub holding said patterned media disk rotatably; a spindle motor rotating said hub; a magnetic head recording or reproducing information to or from said patterned media disk; and an actuator holding and locating said magnetic head at a predetermined position on said patterned media disk.

For the templates, patterned media disks, disk drives, disk drive systems and other nanopatterned structures described herein, according to certain embodiments, the standard deviation $\sigma$ of feature placement error from an ideal periodic pattern is no more than about 1 nm or about 2% or 5% of the ideal pattern pitch. In particular embodiments, where the first pattern is a hexagonal, nearly hexagonal, rectangular, or nearly rectangular array, the standard deviation of the feature placement error from an ideal array is no more than about 1 nm. Also in certain embodiments, each feature has a top surface having a top surface area and the standard deviation of the size distribution of the top surface areas of the pattern is no more than about 2%, 5% or 10% of the mean feature size.

In certain embodiments, the first pattern has circular symmetry about a center point. It may have an inner diameter of at least about 7 mm and an outer diameter of no more than about 98 mm. The pattern may have features arranged in circular tracks around a center point.

One or more additional pattern regions may also disposed on said first side. In certain embodiments the first pattern and the one or more additional patterns each have features arranged in circular tracks around a center point. The first pattern and one or more additional patterns may be arranged in circumferential bands, wherein each band comprises features at a constant angular periodicity about the central point. According to various embodiments, the pattern has long range order over a surface area of at least about at least one square inch or ten square cm.

These and other aspects of the invention are described in further detail and with reference to the following figures below.

BRIEF DESCRIPTION OF THE DRAWINGS

FIG. 2 shows spherical, cylindrical and lamellar ordered copolymer domains formed on substrates.

FIG. 4A shows an illustration of a pattern of a square array of dots, as well a pattern having a lower feature density than the pattern of the square array of dots.

FIG. 11A shows an SEM image of Cr dots after lift-off. FIG. 11B shows an SEM image of the 20 nm tall pillars etched using the Cr mask.

DESCRIPTION OF THE INVENTION

1. Introduction

Figure 1:
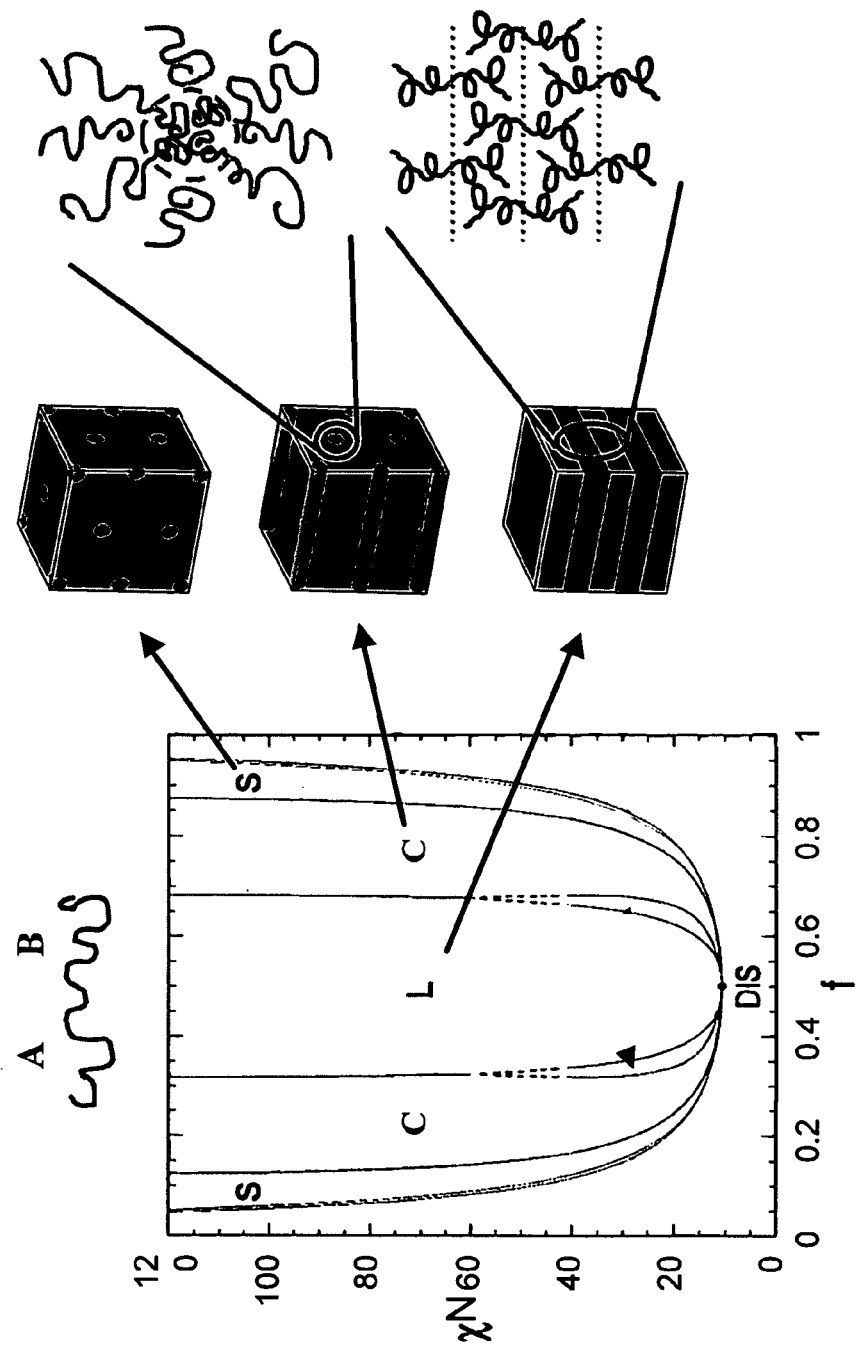
FIG. 1 shows ideal phase behavior of diblock copolymers.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Self-assembling materials spontaneously form structures at length scales of interest in nanotechnology. In the particular case of block copolymers, the thermodynamic driving forces for self-assembly are small and low-energy defects can get easily trapped. Aspects of the invention involve directing the assembly of defect-free arrays of isolated block copolymer domains at densities up to 10 terafeatures/in$^2$ on chemically patterned surfaces. In certain embodiments, comparing the assembled structures to the chemical pattern, the density of the features is increased, e.g., by a factor of two, four, nine or higher. In certain embodiments, dimensional uniformity of the assembled structures to the chemical pattern is improved. Feature placement is improved in certain embodiments. Also in certain embodiments, the methods provide control over feature size, shape, spacing of features within arrays, and the spacing of arrays of features.

Aspects of the invention include high density magnetic storage devices and methods for producing such devices. In certain embodiments, high quality and high density nanolithographic templates are provided. The use of self-assembling materials to define templates for patterning dense features at length scales of 25 nm and below provide a means to continue to shrink the dimensions of electronic and storage devices as optical lithography, the engine of the semiconductor industry, reaches intrinsic technological and economical limits. For magnetic storage devices, the demands for diminishing feature size and spacing outpace those for integrated circuits particularly as the industry considers introduction of patterned media to extend densities beyond limitations imposed by the onset of the superparamagnetic effect in conventional continuous granular media. Self-assembling block copolymers form dense periodic arrays with dimensions and spacing of domains from nanometers to tens of nanometers (e.g., about 3 to 50 nm).

The domain structure of block copolymer thin films has already been used to create templates for defining nanoscale features in metals, semiconductors, and dielectrics for applications as varied as quantum dots and nanoporous membranes for creating insulating air-gaps between wires in integrated circuits. One entry point for block copolymer thin films in fabrication thus capitalizes on inexpensive creation and processing of dense nanoscale features of roughly uniform dimensions.

Although using the domain structure of thin copolymer films to pattern has been termed block copolymer "lithography," known processes of defining features in metals, semiconductors, and dielectrics for various applications have only a superficial relationship to optical or electron beam lithography used in the manufacture of high-performance devices. Lithography, as currently practiced for nanomanufacturing, requires essentially defect-free patterns, control over feature dimensions and shapes with molecular-level tolerances, and precise placement of each patterned feature with respect to the features in the same and underlying and overlying layers.

In embodiments of the methods described herein, the assembly of block copolymer films is directed on lithographically defined chemically nanopatterned surfaces such that 1) the pattern quality (defectivity and uniformity of dimensions) of the patterned features is improved compared to those created using traditional high resolution photoresists and/or 2) the density of features is increased, thereby increasing the resolution of the lithographic tool. Importantly, the methods provide attributes of optical and electron beam lithographic processes, including perfection, registration and a side-wall profile suitable for pattern transfer. The methods are capable of defining individual device elements with some advantage over established lithographic techniques. The techniques described herein allow fabrication of ultrahigh density (>1 Tbit/in$^2$) magnetic bit patterned media within stringent pattern quality requirements—higher densities than obtainable with conventional lithographic tools for these pattern quality requirements.

Hexagonal arrays formed spontaneously by block copolymers may be applied directly for patterned media applications if adequate organization and dimensional uniformity can be achieved in thin film templates. Methods to impart improved ordering in block copolymer films include chemical pre-patterning, graphoepitaxy, solvent annealing, shear, electric fields, flow, thermal gradients and internal fields. Whereas all these methods provide orientational ordering, only chemical pre-patterning and graphoepitaxy provide additional control over translational ordering and feature registration. For patterned media applications, chemical pre-patterning does not compromise storage area (as opposed to graphoepitaxy where topographic features use valuable substrate area), and allows for guidance of the self-assembling system at a sufficient level to address stringent pattern quality requirements including vanishingly small defect densities and control over feature shapes and dimensions. The pre-patterning method, however, is disadvantageous in that it introduces an extra high-resolution lithographic step. In the methods described herein, the self-assembling block copolymer exercises some pattern rectification action (quality enhancement), feature density multiplication (resolution enhancement/cost reduction), providing improvement in quality and density over traditional lithographic processes.

As indicated above, the methods described use block copolymers. Block copolymers are a class of polymers that have two or more polymeric blocks. The structure of diblock copolymer AB, also denoted A-b-B, may correspond, for example, to AAAAAAA-BBBBBBBB. FIG. 1 shows theoretical phase behavior of diblock copolymers. The graph in FIG. 1 shows, $\chi N$ (where $\chi$ is the Flory-Huggins interaction parameter and N is the degree of polymerization) as a function of the volume fraction, f, of a block (A) in a diblock (A-b-B) copolymer. $\chi N$ is related to the energy of mixing the blocks in a diblock copolymer and is inversely proportional to temperature. FIG. 1 shows that at a particular temperature and volume fraction of A, the diblock copolymers microphase separate into domains of different morphological features. As indicated in FIG. 1, when the volume fraction of either block is around 0.1, the block copolymer will microphase separate into spherical domains (S), where one block of the copolymer surrounds spheres of the other block. As the volume fraction of either block nears around 0.2-0.3, the blocks separate to form a hexagonal array of cylinders (C), where one block of the copolymer surrounds cylinders of the other block. And when the volume fractions of the blocks are approximately equal, lamellar domains (L) or alternating stripes of the blocks are formed. Representations of the cylindrical and lamellar domains at a molecular level are also shown. Domain size typically ranges from 2 nm or 3 nm to 50 nm. The phase behavior of block copolymers containing more than two types of blocks (e.g. A-b-B-b-C), also results in microphase separation into different domains. The size and shape of the domains depend on the molecular weight and composition of the copolymer.

FIG. 2 shows spherical, cylindrical and lamellar ordered domains formed on substrates. Domains (spheres, cylinders or lamellae) of one block of the copolymer are surrounded by the other block copolymer. As shown in FIG. 2, cylinders may form parallel or perpendicular to the substrate. While the FIGS. 1 and 2 show phase behavior of diblock copolymers for illustrative purposes, the phase behavior of block copolymers containing more than two types of blocks (e.g., A-b-B-b-C) also results in microphase separation into different architectures. It should also be noted that while much of the description below describes methods and resulting devices that use block copolymer materials having perpendicular cylindrical morphologies, the methods and devices are not so limited and extend to any morphology that is of interest in defining pattern features.

A block copolymer material may be characterized by bulk lattice constant or period $L_o$. For example, a lamellar block copolymer film has a bulk lamellar period or repeat unit, $L_o$. For cylindrical and spherical domain structures, the periodicity of the bulk domain structures can be characterized by the distance between the cylinders or spheres, e.g., in a hexagonal array. Periodic patterns formed on substrates or in thin block copolymer films may also be characterized by characteristic lengths. "L" is used herein to denote a characteristic length or spacing in a pattern. It may be referred to as a lattice constant, pitch, period or length. For example, a lamellar period $L_s$ of a two-phase lamellar substrate pattern may be the width of two stripes. $L_s$ is used herein to denote the period, pitch, lattice constant or other characteristic length of a substrate pattern.

As indicated above, aspects of the invention relate to increasing the density of features in a pattern and improving pattern quality as compared to pattern using traditional high resolution lithographic tools. FIGS. 3-6 present overviews of density multiplication and pattern rectification processes according to various embodiments, with details, examples, parameters and applications then discussed below with reference to FIGS. 7-14.

Figure 3:
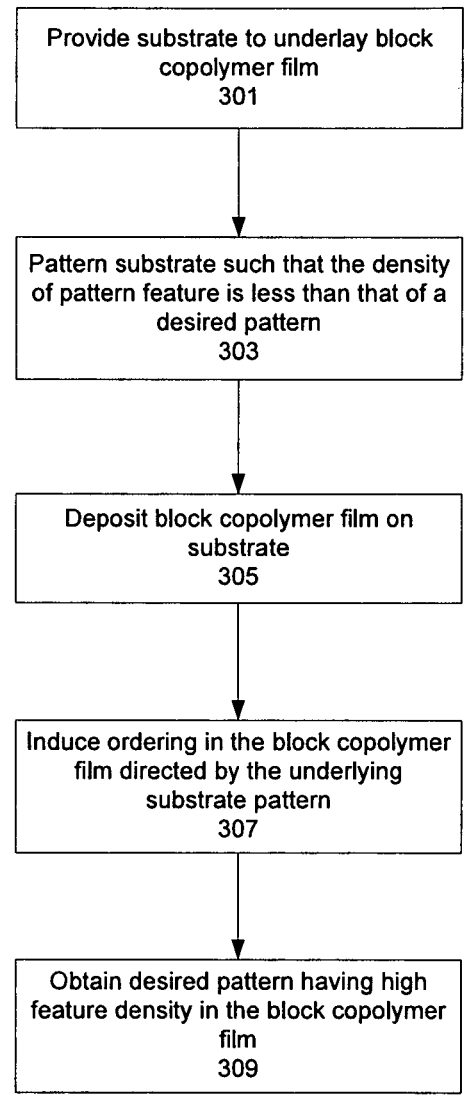
FIG. 3 is a flow diagram showing operations in a density multiplication of lithographically patterned features according to certain embodiments.

One aspect of the invention relates to density multiplication of pattern features. By multiplying the density of pattern features, the resolution of the lithographic tool is increased. FIG. 3 is a process flow diagram illustrating operations in according to certain embodiments. The process begins by providing a substrate to support or underlay a block copolymer thin film (301). The substrate surface is then patterned, e.g., by e-beam lithography (303). As used herein, substrate surface may refer to the surface of a material or layer on the substrate. As discussed below, in many embodiments, patterning the substrate involves creating a chemical contrast pattern in a thin film on the substrate. In a specific example, a polymer brush thin film is chemically modified to create a pattern, with the pattern features defined by regions of chemical contrast. Regardless of the method or materials used in patterning, a pattern is provided defined by regions of chemical contrast or otherwise activated or inactivated regions.

The pattern created at the substrate surface has a lower density of features than the desired pattern in the eventual film or device. For example, for a desired pattern of a hexagonal array of dots having a lattice constant $L_d$, a substrate pattern of $L_s=2L_d$ may be created. In another example shown in FIG. 4A, a desired pattern of a square array of dots having a lattice constant $L_d$ is shown at 401. A substrate pattern having a lattice constant $L_s=2L_d$ is shown at 403. The density of the dot features of pattern 403 is one-half linearly of pattern 401 and one-fourth area-wise that of pattern 401.

Figure 4B:
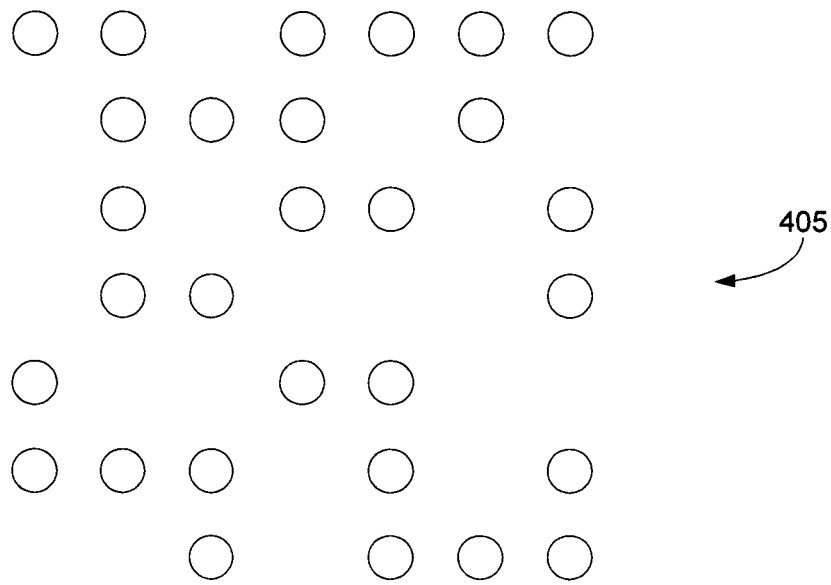
FIG. 4B is another pattern having a lower feature density than the pattern of the square array of dots shown in FIG. 4A.
Figure 4C:
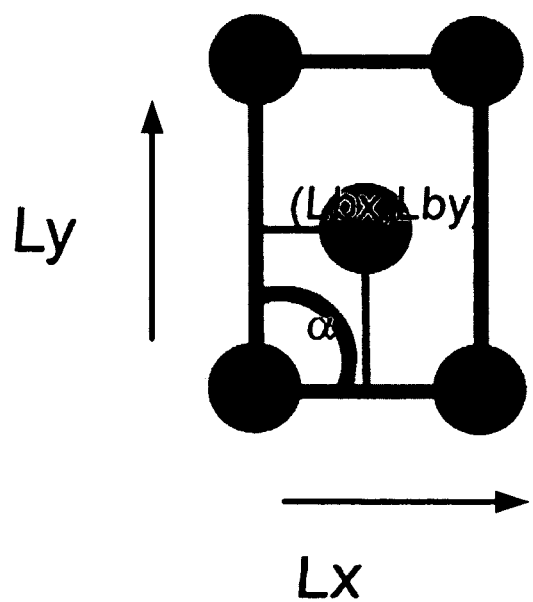
FIG. 4C is an illustration of a rectangular array and its lattice constants.

In certain embodiments, the pattern created at the substrate is periodic, such as that shown at 403 in FIG. 4A. For a two dimensional pattern such as that in FIG. 4A, the ideal pattern can be characterized by 2 lattice vectors and, in certain embodiments, a basis). FIG. 4C shows a rectangular lattice with two dots in the basis. $L_x$ and $L_y$ are the two lattice vectors and $L_{by}$ and $L_{bx}$ are the basis vectors. A periodic substrate pattern can then be generated by any linear combination of the ideal pattern lattice vectors $L_x$ and $L_y$. In certain embodiments, the pattern lattice constant or other characteristic length $L_s$ may be $n \times L_d$, where n is an integer greater than or equal to 2. For a two-dimensional pattern, such as those shown in FIG. 4A, the feature density of the substrate pattern is $L_d/(n^2)$, e.g., $L_d/4$ for n=2, $L_d/9$ for n=3, $L_d/16$ for n=4, etc. Although it may be convenient depending on the patterning technique to create a periodic substrate pattern, the density multiplication techniques described herein do not require a periodic pattern, as long as the pattern features of the substrate pattern correspond to a subset of the pattern features of the desired pattern. An example of such a pattern in shown at 405 in FIG. 4B. The features of pattern 405 correspond to a subset of the features of pattern 401 shown in FIG. 4A, in this case slightly more than half of the features of pattern 401 are in pattern 405. Corresponding features are features whose placement in relation to other features in the pattern matches the placement of the desired pattern features. In general, it can be thought of as "removing" some percentage of the features of the desired pattern, with the spacing of the remaining features left intact. While the example shown in FIG. 4B has slightly more than half of the features of the desired pattern 401, according to various embodiments, the substrate pattern may have at most 80%, 70%, 60%, 50%, 40%, 30%, 20% or 10% of the number of features of the desired pattern. It should also be noted that in certain embodiments, the substrate pattern may be a periodic pattern, but with n equal to a non-integer. For example, in certain embodiments, $L_s=(\sqrt{2})L_d$ results in a pattern that is periodic and whose features correspond to a subset of the features in $L_d$. For the FIG. 4A, this corresponds to keeping the dots on every other diagonal line for certain dot arrays. Similarly, with other periodic substrate patterns, in certain embodiments, an $L_s$ that is not at an integer multiple of $L_d$ can be used to generate a periodic substrate pattern that can be used to direct assembly of a pattern having $L_d$.

In certain embodiments, while the pattern may not have an underlying periodicity, it may be advantageous for the substrate pattern features may be approximately uniformly distributed over the pattern area, i.e., so that there are enough features to direct the assembly of the block copolymer film over the entire pattern area.

Returning to FIG. 3, after the substrate is patterned, a layer of material containing a block copolymer is deposited on the patterned substrate (305). For example, the material may be a block copolymer/homopolymer blend. In many embodiments, the copolymer material is chosen such that the lattice constant $L_o$ is within about 10% of the desired lattice constant $L_d$, i.e., so that $L_s=nL_o$ (+/−10%) in cases where the substrate pattern is periodic. (It should also be noted that while in certain embodiments, the bulk lattice constant or period $L_o$ is the same as the desired pattern, there may be situations it which this is not the case.)

Components of the block copolymer material are then ordered as directed by the underlying pattern (307). To induce ordering, the block copolymer material is typically annealed above the glass transition temperature of the blocks of the copolymer material. The resulting block copolymer film is patterned with features defined by microphase separated domains, with the feature density higher than that of the original substrate pattern and the features registered with the underlying substrate (309).

Figure 5:
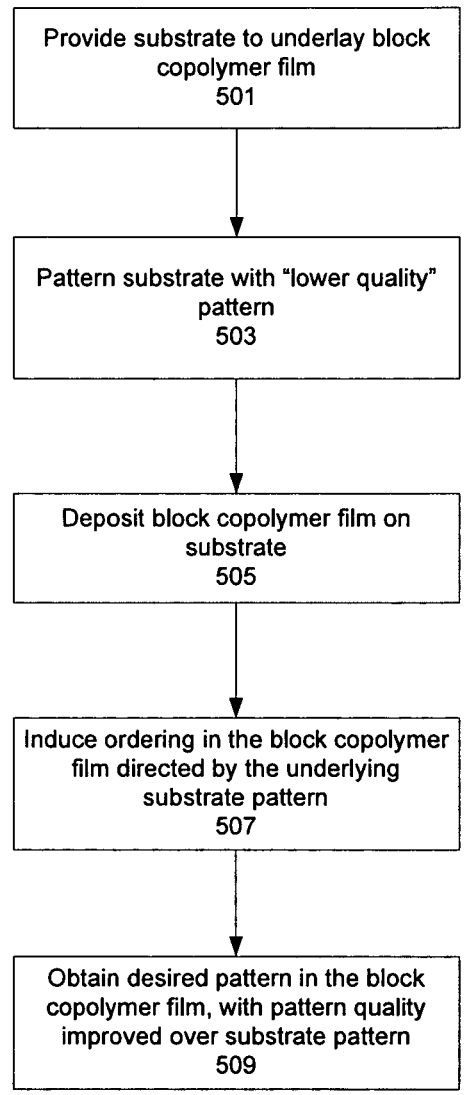
FIG. 5 is a flow diagram showing operations in rectifying lithographically patterned features according to certain embodiments.
Figure 6:
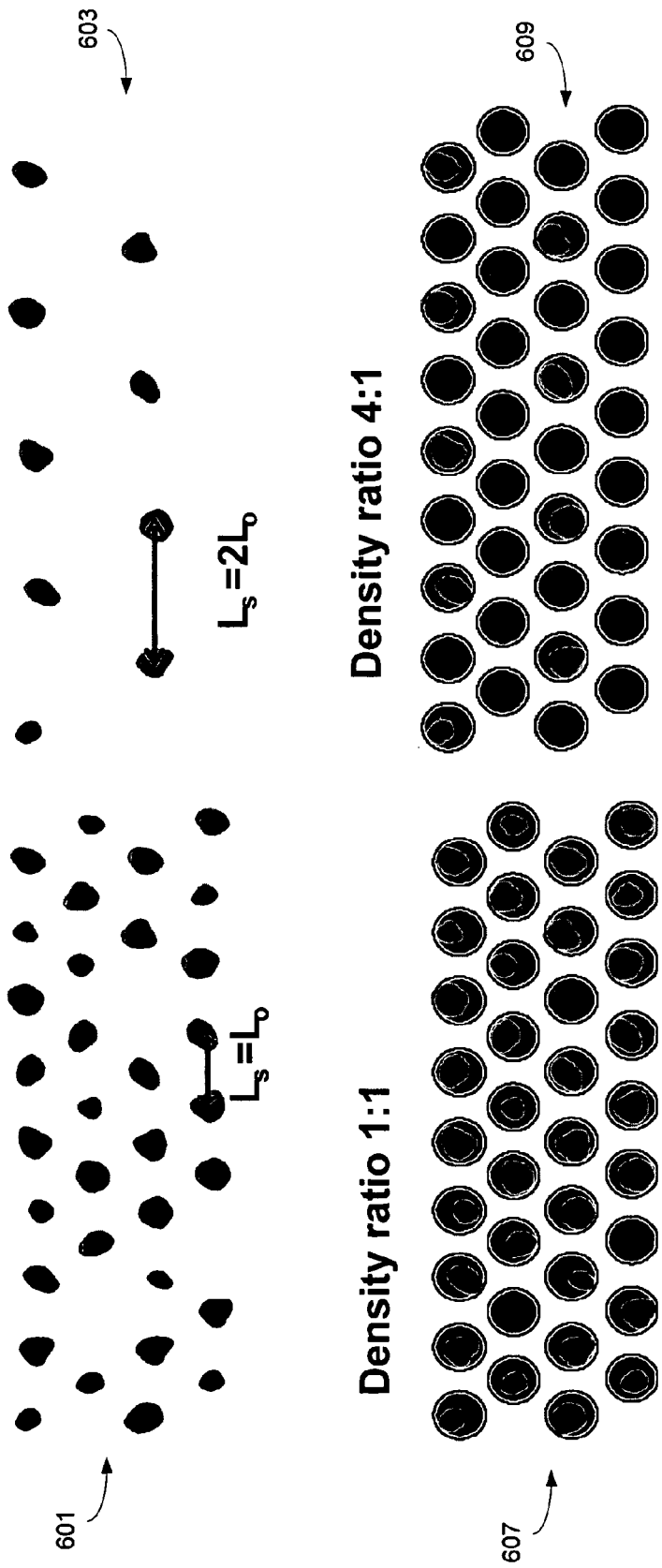
FIG. 6 is an illustration of a pattern rectification according to certain embodiments.

Another aspect of the invention relates to pattern rectification or improving the quality of the substrate pattern. FIG. 5 is a process flow diagram illustrating operations according to certain embodiments. As with the process described in FIG. 3, the process beings by providing a first substrate to support or underlay a block copolymer thin film (501). The substrate surface is then patterned with a "lower quality" pattern (503). Pattern quality may be characterized by one or more of the following: feature size, feature size distribution (uniformity in feature size), feature shape and feature placement (e.g., spacing of features within in arrays and spacing of array elements) as compared to a desired pattern. FIG. 6 shows examples of substrate patterns 601 and 603, e.g., as made by an e-beam. The desired patterns of hexagonal array of dots is shown at 607 and 609, formed from directed assembly on e-beam patterns 601 and 603 respectively. The pattern 601 is a lower quality pattern than the hexagonal array of dots shown at 607 in that the pattern features are of various sizes, are not uniform circles, and that the spacing between features is not uniform due to feature placement error. In addition, some dots in pattern 601 are missing altogether. Similarly, pattern 603 is a lower quality pattern than pattern 609. According to various embodiments, the feature density of the pattern may be the same as that of the desired pattern, or it may be less than that of the desired pattern as in the methods of FIG. 3. Substrate pattern 601, for example, has the same density of features as the desired hexagonal array of spots 607, while substrate pattern 603 has one-fourth the density of the desired hexagonal array of spots 609.

Returning to FIG. 5, after the substrate is patterned, a layer of material containing a block copolymer is deposited on the patterned substrate (505). Components of the block copolymer material are then ordered as directed by the underlying pattern (507). The resulting film is patterned, with pattern quality improved over the original substrate pattern. (509).

Figure 7:
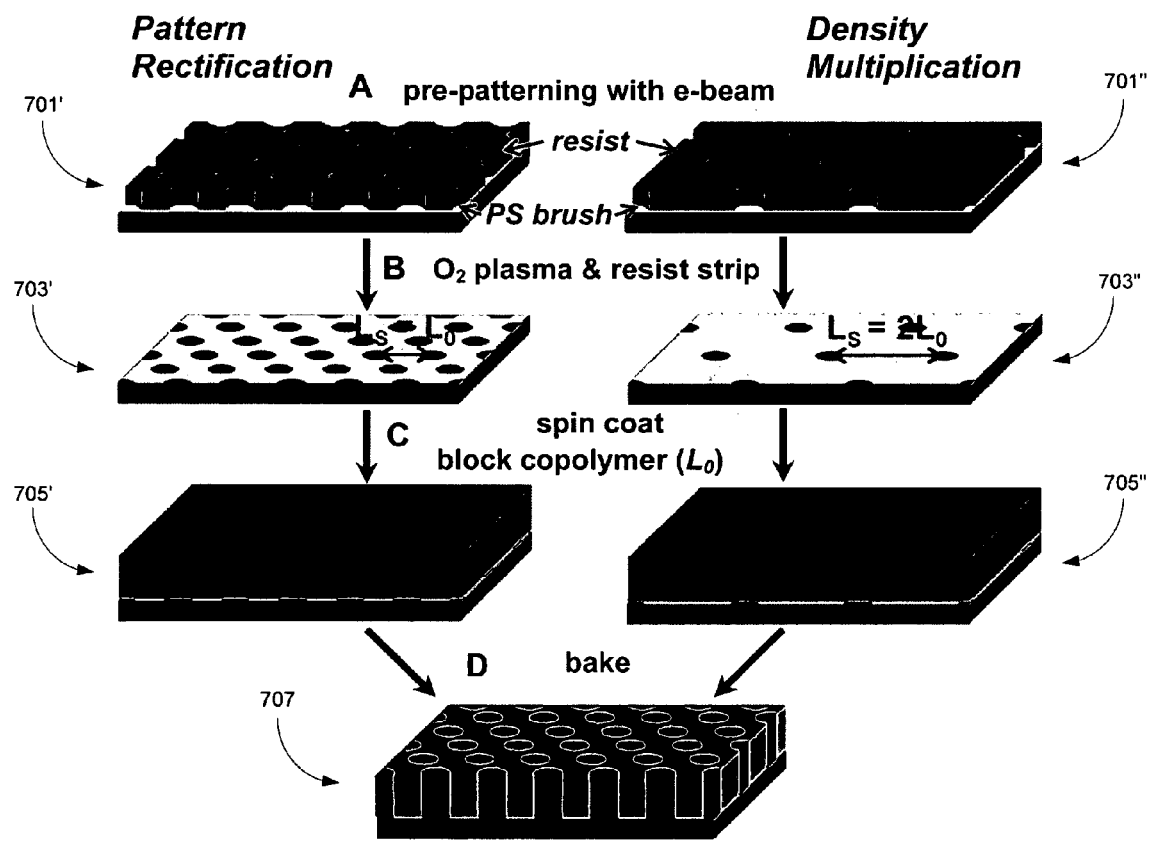
FIG. 7 is a schematic illustration of an assembly process of thin films of poly(styrene-block-methyl methacrylate) (PS-b-PMMA) used to demonstrate both density multiplication and pattern quality rectification on substrates pre-patterned by e-beam lithography.

Examples of pattern rectification and density multiplication in generating hexagonal arrays of perpendicularly oriented PMMA cylinders in a PS matrix using two copolymers with different lattice constants ($L_o=39$ nm, and $L_o=27$ nm) are described below with respect to FIGS. 7-9B. First, FIG. 7 shows a schematic illustrating the assembly process of thin films of poly(styrene-block-methyl methacrylate) (PS-b-PMMA) used to demonstrate both density multiplication and pattern quality rectification on substrates pre-patterned by e-beam lithography. A $SiO_x$ substrate after various stages (A, B, C and D) in the assembly process is shown in the figure. First, a brush of hydroxyl-terminated polystyrene ($M_n=6$ Kg/mol) was deposited on a $SiO_x$ substrate. An e-beam resist layer was applied and an electron beam used to write the closest possible match to a hexagonal pattern with a lattice constant $L_s$ such that $L_s=nL_o$ with n=1 or 2 over a total area of 100 µm×100 µm. (For $L_s=39$ and 78 nm, additional patterns covering 3000 µm×50 µm were made). Patterns with both n=1 and n=2 were written on the same sample. (After developing the e-beam resist, representative samples were saved for imaging and metrology of the patterns created by traditional e-beam lithography.) The substrate having a PS brush and overlying patterned layer of resist is shown at 701' (for the pattern rectification process, with n=1) and 701" (for the density multiplication process, with n=2) In stage B, samples for block copolymer assembly were subjected to a brief dose of oxygen plasma to generate a chemical contrast on the substrate. The bulk of the resist was removed to leave the substrate patterned with a hexagonal array of spots. The patterned substrates are shown at 703' (for n=1, $L_s=L_o$) and 703" (for n=2, $L_s=2L_o$). Depositing a layer of polymer brush, applying an e-beam resist layer, patterning the resist layer, generating a chemical contrast on the substrate and removing the resist are all operations that may be performed to pattern the substrate as in operations 303 and 503 of FIGS. 3 and 5, respectively. As described further below, however, patterning the substrate is not limited to this particular method but may be done by any appropriate method. In stage C, a block copolymer film having a lattice constant $L_o$ was spun on the patterned substrates. The patterned substrates with spun-on block copolymer films are shown at 705' and 705". In stage D, the films were then annealed in vacuum. The areas of the surface (arrays of spots) exposed to the oxygen plasma were preferentially wet by the PMMA block, and background areas are slightly preferential towards the PS block. The film was thus ordered to form perpendicular cylinders of PMMA in a hexagonal array as shown at 707. (Perpendicular cylinders with defects including short sections of parallel cylinders were observed on areas of the sample adjacent to the patterned regions).

The PMMA domains were then selectively removed. Scanning electron micrographs (SEM) can be used quantify the feature size uniformity of both block copolymer and e-beam features. The improved quality of patterning afforded by directing the assembly of block copolymer films on lithographically-defined chemically patterned surfaces in comparison to the lithographically-defined patterns themselves is presented in FIG. 8A-8L. FIGS. 8A-8D show top-down SEM images of developed e-beam resist patterned at $L_s=39$, 78, 27 and 54 nm respectively. FIGS. 8E-8H show micrographs of the block copolymer films guided by the pre-pattern with the corresponding e-beam features above. The polymer pitch on the guided patterns ($L_p$) is 39, 39, 27 and 27 nm respectively. In FIGS. 8I-8L, the dot size distributions of both the e-beam and the corresponding block copolymer patterns from at least 15000 dots are plotted.

Figures 8A, 8B, 8C, 8D, 8E, 8F, 8G, 8H, 8I, 8J, 8K, 8L:
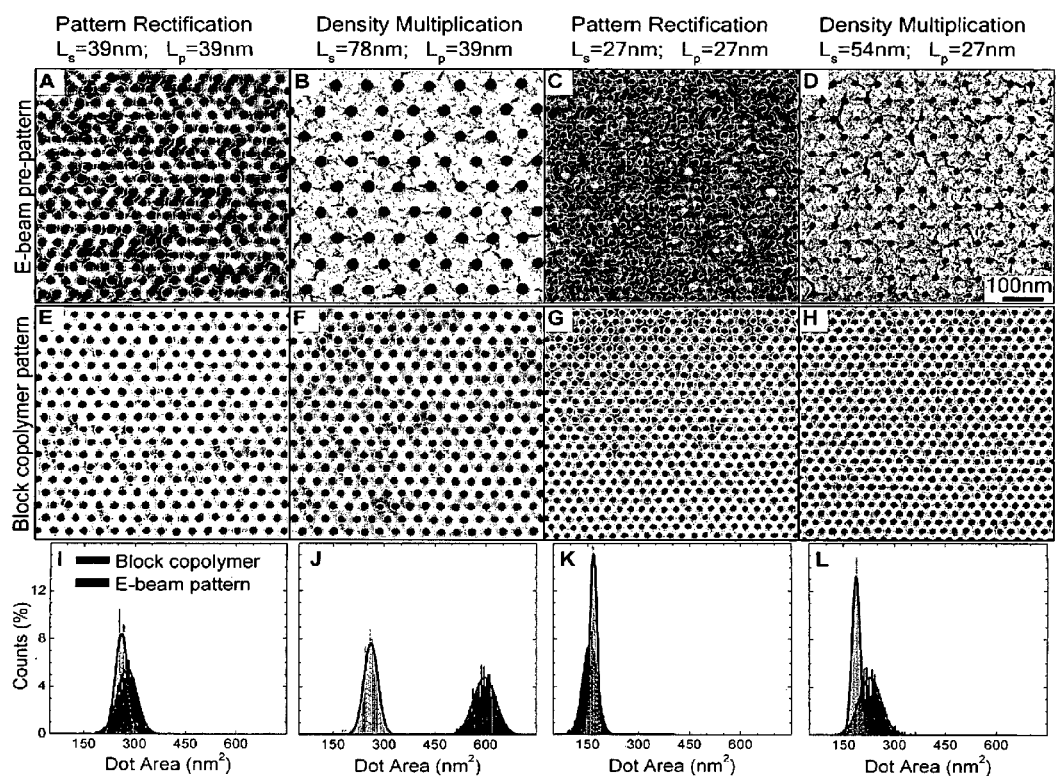
FIGS. 8A-8D show top-down SEM images of developed e-beam resist patterned at $L_s$=39, 78, 27 and 54 nm, respectively.
FIGS. 8E-8H show micrographs of the block copolymer films guided by the pre-pattern with the corresponding e-beam features shown in FIGS. 8A-8D. The polymer pitch on the guided patterns ($L_p$) is 39, 39, 27 and 27 nm, respectively.
FIGS. 8I-8L are plots of the dot size distributions of both the e-beam and the corresponding block copolymer patterns shown in FIGS. 8A-8H.

FIGS. 8A and 8C show an e-beam pattern for Ls=39 and Ls=27 nm, respectively, with FIGS. 8E and 8G showing the block copolymer films formed on comparable e-beam patterns. Comparing FIG. 8A with FIG. 8E and FIG. 8C with 8G shows that the e-beam pattern has a lower quality apparent in variations in distance between rows and dot size distribution. Both of these sources of noise are rectified by the block copolymer as shown in FIGS. 8E and 8G. At $L_s=39$ nm, the e-beam pattern shows an average dot size of $A_s=276$ nm$^2$ with a standard deviation $\sigma_s=30$ nm$^2$ while the block copolymer pattern had an average dot size $A_p=262$ nm$^2$ with $\sigma_p=23$ nm$^2$, rectifying the quality of the e-beam pre-pattern by narrowing the dot size distribution, as shown in FIG. 8I. The e-beam resist pattern at $L_s$=27 nm (FIG. 8C) does not have enough resolution to define a useful lithographic mask nor does it display the necessary statistics on dot size, shape or placement required for the application. Nonetheless, the block copolymer film shown in FIG. 8G that is formed on a $L_s$=27 nm pattern maintains a uniform lattice constant. The dot size distribution plot shown in FIG. 8K shows that the block copolymer film rectifies the dot size distribution of the e-beam pre-pattern from $\sigma_s$=26 nm² down to $\sigma_p$=11 nm².

As discussed above, directed assembly may be implemented not only to improve the quality but to substantially augment the capabilities of the lithographic process beyond current resolution limits. FIG. 8B shows the e-beam resist used to pre-pattern the substrate at $L_s$=2$L_o$=78 nm. The block copolymer shown in FIG. 8F registers with the pre-patterned site. The lattice with $L_s$=2$L_o$ is nearly commensurate to the natural lattice of the block copolymer and the self assembly interpolates the location of the PMMA cylinders in between the pre-patterned dots multiplying the density of features by a factor of four (two in each direction in analogy to heteroepitaxial thin films) in addition to maintaining a constant and uniform feature size. The commensurability tolerance is about +/−0.1$L_o$ for the average lattice spacing. The resultant pattern is commensurate with the substrate pattern; the period of the self-assembled pattern adjusts itself to be commensurate with the substrate pattern as long as the natural period falls within a certain tolerance range, such as +/−0.1$L_o$ in certain embodiments. The e-beam pre-pattern at $L_s$=2$L_o$=78 nm has an average area $A_s$=595 nm² with $\sigma_s$=35 nm. The block copolymer not only multiplies the feature density, but also rectifies the dot area size by more than a factor of two to keep it constant at $A_p$=260 nm² with $\sigma_p$=22 nm². Similar rectification occurs for $L_s$=39 nm as shown in FIGS. 8I and 8J. For $L_s$=2$L_o$=54 nm the polymer also multiplies the feature density to 1 Tdot/in² (27 nm pitch) as shown in FIGS. 8D and 8H while rectifying the size distribution from $\sigma_s$=39 nm² on the e-beam pattern down to $\sigma_p$=13 nm² on the block copolymer, as shown in FIG. 8L.

Long range order is preserved throughout the entire pre-patterned area (100×100 μm² and 3000×50 μm² for some samples) with defect densities that are compatible with data storage requirements. High-resolution SEM image analysis was performed on a sampling set of images comprising about 15000-20000 dots total. Based on this sampling a defect density less than $10^{-4}$ for patterns with $L_s$=39, 78 and 27 nm and less than $10^{-3}$ for patterns with $L_s$=54 nm was estimated. This is compared to a projected defect tolerance in bit patterned media on the order of 1 dot in $10^4$-$10^6$ depending on the algorithms and countermeasures used. Long range order is shown in larger area images (4 μm long) and even larger (tens of microns long) Moiré interference patterns (not shown).

Placement accuracy was quantified by measuring the standard deviation of placement error away from the ideal pattern along the x-direction ($\sigma_x$) and the y-direction ($\sigma_y$). Representative results are summarized in Table 1. At smaller dimensions the block copolymer patterns have tighter distributions and the statistics are preserved for the multiplied and non-multiplied patterns. As a comparison, placement tolerances for patterned media are projected to be standard deviation σ about less than or equal to about 1 nm or 5% of the pitch in the ideal pattern.

TABLE 1

Standard deviation of dot placement errors along the x-direction ($\sigma_x$) and the y-direction ($\sigma_y$) on the e-beam defined patterns (having pitches Ls) and the block copolymer films (having pitches Lp).

| Pattern pitch (nm) | | $\sigma_x$ (nm) | | $\sigma_y$ (nm) | |
| --- | --- | --- | --- | --- | --- |
| Ls | Lp | e-beam | copolymer | e-beam | Copolymer |
| 39 | 39 | 2.1 | 1.3 | 2.2 | 1.3 |
| 78 | 39 | 1.4 | 1.2 | 1.0 | 1.3 |
| 27 | 27 | 3.4 | 1.2 | 3.5 | 1.1 |
| 54 | 27 | 2.2 | 1.2 | 2.0 | 1.2 |

At smaller dimensions, the block copolymer pattern has tighter distributions, and the statistics are the same for the density multiplied and non-multiplied patterns.

Figure 9A:
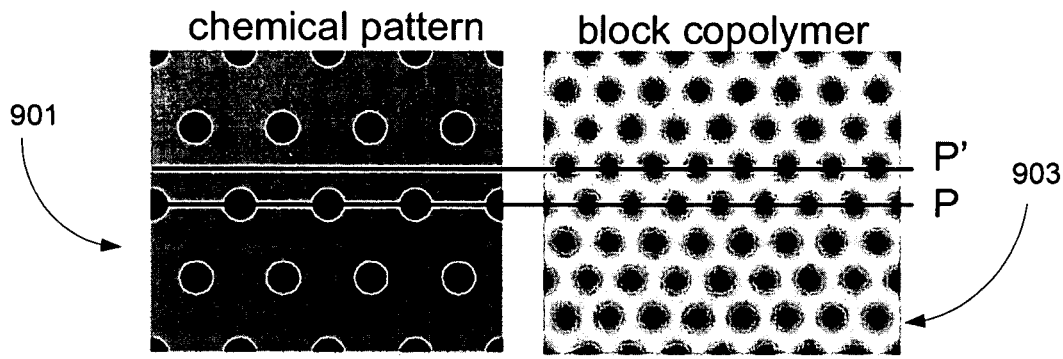
FIG. 9A shows results of a simulation in which a block copolymer film was grown on a chemical spot pattern. The simulated spot pattern and a horizontal cross section of the simulated system taken at mid-height of block copolymer film are shown.
Figure 9B:
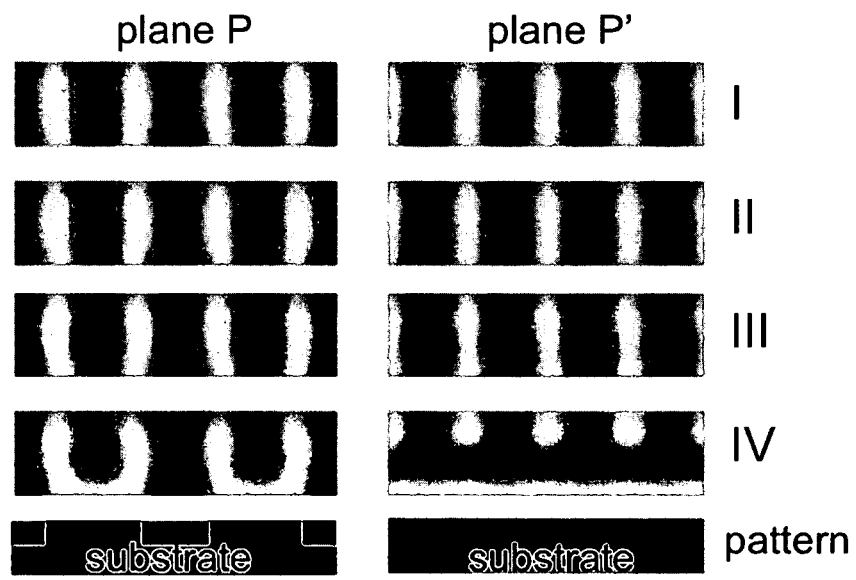
FIG. 9B shows results of a simulation in which the formation of PS-b-PMMA block copolymer films at various interfacial energies between a chemically patterned PS brush surface and the blocks of the copolymer film.

Metrics of pattern quality that can not be determined from top-down SEM images relate to the shapes and dimensions of features in the pattern transfer template. Of particular importance is the side wall profile of the mask. The three-dimensional structure of the domains through the film thickness may be very different than plan view images or even bulk block copolymer morphologies are strong functions of the geometry and strength of interactions between the polymer and the patterned substrate. FIGS. 9A and 9B show the results of Monte Carlo simulations of the fundamental physics of assembly in the case of the interpolated structures by resorting to Monte Carlo simulations of. Parameters in the simulations were chosen to describe a block copolymer with $L_o$=39 nm, a film thickness of about 1.1 $L_o$, a spot pattern with $L_s$=2$L_o$, and spot size equal to twice the natural cylinder area. A simulated chemical spot pattern 901 and a horizontal cross section 903 of the simulated system taken at mid-height of block copolymer film are shown in FIG. 9A. A simulated system typically contained 60 cylinders. The PMMA block wets the spots and the PS block wets the background of the chemical pattern. The interactions between the patterned spots and the PMMA block ($\Lambda_{PMMA}$) and the patterned background and the PS block ($\Lambda_{PS}$) play a critical role with respect to the three-dimensional structure of the assembled domains. The interfacial energies between the chemically patterned PS brush surface and the blocks of the copolymer are not known quantitatively, but $\Lambda_{PMMA}$ is expected to be medium or strong and $\Lambda_{PS}$ is expected to be weak. Four cases are considered to encompass these expectations, and are presented in FIG. 9B: (I) weak $\Lambda_{PMMA}$ and weak $\Lambda_{PS}$, (II) strong $\Lambda_{PMMA}$ and weak $\Lambda_{PS}$, (III) medium $\Lambda_{PMMA}$ and medium $\Lambda_{PS}$, and (IV) strong $\Lambda_{PMMA}$ and strong $\Lambda_{PS}$. In the model, the strength of interaction between the patterned substrate and a block is quantified by $\Lambda N$, where N is the number of beads per copolymer chain. The strong interaction ($\Lambda N$=2.1) considered corresponds to the interfacial energy between PMMA and a silicon oxide substrate. The medium and weak interactions correspond to two-thirds and one-third of that value, respectively. The non-preferred block has an equal but repulsive interaction in all cases. Image 903 in FIG. 9A shows a representative cross section for all of the cases at half height in the plane of the film showing the interpolation of cylindrical domains (with diameter comparable to the natural cylinder diameter) at four times the density with respect to the chemical pattern. FIG. 9B shows vertical cross sections of the assembled domains through rows of cylinders on chemically patterned spots alternating with interpolated cylinders (plane P at 905), and vertical cross sections of rows of interpolated cylinders (plane P' at 907). The cross-sections represent a long-time simulation that averages over thermal fluctuations, but highlight the effect of the pattern on the average cylinder shape. Cases I-III depict equilibrium scenarios for which a perpendicular orientation of the cylinders is achieved through the full thickness of the film with case I being the most uniform. Medium $\Lambda_{PMMA}$ causes the non-interpolated cylinders to adopt an undercut profile (case II). For even stronger $\Lambda_{PMMA}$, some of those cylinders actually break into two halves (not shown). If $\Lambda_{PS}$ and $\Lambda_{PMMA}$ are both increased (case III) then the interpolated cylinders exhibit a slight constriction at their base. Finally, in the limit of strong $\Lambda_{PMMA}$ and strong $\Lambda_{PS}$ (case IV), interpolated cylinders do not extend all the way to the substrate and form a complicated three-dimensional network. They end at a distance of about 8 nm from the substrate, and are connected to each other in the plane of the film forming perimeters of hexagons, centered around cylinders extending vertically away from each patterned spot. At the surface of the film, however, the observed pattern is the same as in other cases, namely a hexagonal array of spots. These simulated scenarios indicate there is a window of tolerance for density multiplication to work successfully within a range of interaction values. The window of tolerance provides the ability to generate lower defect densities or even higher orders of density multiplication. For example, a brush layer is chosen such that the brush interactions in density multiplied patterns with $L_s$=54 nm has a defect density below $10^{-4}$.

The methods described above are not limited to cylinder forming block copolymers or patterns of arrayed dots, but may be used with any appropriate block copolymer morphology and desired pattern. For example, density multiplication has been demonstrated for lamellar forming block copolymers of various sizes on substrate patterns, with $L_s$=$nL_o$. Substrate patterns were generated as described above with respect to the cylinder forming block copolymers, with the width of the PMMA wetting lines equal to about $L_o/2$. Table 2, below, shows $L_o$'s and $L_s$'s used to generate well ordered lamellar thin films registered with the underlying substrate.

| Block Copolymer and size | $L_o$ | $L_s$ | $L_p$ | Order of density multiplication |
|---|---|---|---|---|
| PS-b-PMMA (52-52) | 50 | 100 | 50 | 2 |
| PS-b-PMMA (37-37) | 45 | 90 | 45 | 2 |
| PS-b-PMMA (18-18) | 30 | 60 | 30 | 2 |
| PS-b-PMMA (18-18) | 29.5 | 90 | 29.5 | 3 |

The effect of commensurability of the substrate pattern with lamellae forming block copolymer material was also demonstrated, with using substrate patterns with $L_s$=$nL_o$ for the following n: 0.87, 0.98, 1.31, 1.53, 1.75, 1.97, 2.03, 2.37, 2.71 and 3.05. Broadly speaking, the films at 0.87, 0.98, 1.75, 1.97, 2.03 and 3.05 were well-ordered and disorder at 1.31, 1.53, 2.37 and 2.71.

Parameters

Substrate

Any type of substrate may be used. In semiconductor applications, wherein the block copolymer film is to be used as a resist mask for further processing, substrates such as silicon or gallium arsenide may be used. For patterned media applications, a circular substrate may be used. A master pattern for patterned media may be made on almost any substrate material, e.g., silicon, quartz, or glass. (This pattern in turn gets transferred to multiple working nanoimprinting templates in certain embodiments, as discussed further below.)

According to various embodiments, the substrate may be provided with a thin film or imaging layer thereon. The imaging layer may be made of any type of material that can be patterned or selectively activated. In a certain embodiment, the imaging layer comprises a polymer brush or a self-assembled monolayer. Examples of self-assembled monolayers include self-assembled monolayers of silane or siloxane compounds, such as self-assembled monolayer of octadecyltrichlorosilane.

In certain embodiments, the imaging layer or thin film to be patterned is a polymer brush layer. In certain embodiments, the polymer brush may include one or more homopolymers or copolymers of the monomers that make up the block copolymer material. For example, a polymer brush of at least one of styrene and methyl methylacrylate may be used where the block copolymer material is PS-b-PMMA. One example of a polymer brush to be used in a thin film is PSOH.

As discussed above with respect to FIGS. 9A and 9B, the interfacial energy between the substrate and the components of the block copolymer material affect the shape of the assembled domains. In certain embodiments, the substrate may be "neutral," i.e., the interfacial energy $\Lambda_A$ between polymer A of a A-b-B block and the substrate is roughly the same as the interfacial energy $\Lambda_B$. In other embodiments, the substrate is mildly or strongly preferential to one of the components of the block copolymer (or a subset of components of a higher order block copolymer).

Patterning the Substrate

The substrates may be patterned by any method, including all chemical, topographical, optical, electrical, mechanical patterning and all other methods of selectively activating the substrate.

In embodiments where the substrate is provided with an imaging layer (such as a self-assembled monolayer or polymer brush layer) patterning the substrate may comprise patterning the imaging layer. Alternatively, a substrate may be patterned by selectively applying the pattern material to the substrate.

The substrate patterning may comprise top-down patterning (e.g. lithography), bottom-up assembly (e.g. block copolymer self-assembly), or a combination of top-down and bottom-up techniques. In certain embodiments, the substrate is patterned with x-ray lithography, extreme ultraviolet (EUV) lithography or electron beam lithography.

In certain embodiments, because density multiplication allows the substrate pattern to have a lower density than the final desired pattern, the e-beam or other lithographic tool write time is greatly reduced.

Substrate Pattern

The surface pattern (as well as the block copolymer material used) affect self-assembled domains that result from the processes described above. The surface pattern and the block copolymer film deposited on it are chosen to achieve the desired pattern in the block copolymer film.

In certain embodiments, there is a 1:1 correspondence between the number of features patterned on the substrate (by e-beam lithography or other technique) and the number of features in the self-assembled block copolymer film. These are embodiments in which the density of features is not multiplied. It should be noted that in certain cases, the 1:1 correspondence might not be exactly 1:1 but about 1:1, e.g., due to imperfections in the substrate pattern. The directed assembly may or may not be epitaxial according to various embodiments. That is, in certain embodiments, the features as defined by the block copolymer domains in the block copolymer film are located directly above the features in the chemical contrast pattern on the substrate. In other embodiments, however, the growth of the block copolymer film is not epitaxial. In these cases, the chemical contrast (or other substrate pattern) may be offset from the self-assembled domains. The geometry of the substrate pattern is generally commensurate with the geometry of the pattern in the self-assembled block copolymer film: to generate hexagonally arrayed cylinders, the substrate is patterned with hexagonally arrayed dots; to generate square arrays of cylinders, the substrate is patterned with square arrays of dots, etc.

For many patterning techniques, making a perfect hexagonal is very difficult. The substrate pattern may thus be an approximate hexagonal lattice, or a rectangular array with an extra dot in the center of the rectangle closely matching the equivalent hexagonal array. Similarly, substrate patterns may approximate other geometric patterns.

In density multiplication techniques, the features in the substrate pattern are a subset of features in a pattern having a density and geometry commensurate with the desired pattern. The number of features in the substrate pattern is less than the number in the block copolymer film, as discussed above, the substrate pattern have 10% or even fewer of the number of features in the self-assembled film. The geometry of the substrate pattern itself is not necessarily commensurate with the desired pattern. As described above with respect to FIG. 4c, the substrate pattern itself may have no underlying periodicity.

In certain embodiments, the pattern corresponds to the geometry of the bulk copolymer material. For example, hexagonal arrays of cylinders are observed bulk morphologies of certain PS-b-PMMA and other block copolymers. However, in other embodiments, the substrate pattern and the bulk copolymer material do not share the same geometry. For example, a block copolymer film having domains of square arrays of cylinders may be assembled using a material that displays hexagonal arrays of cylinders in the bulk.

Although the substrate pattern features correspond to features in the desired pattern, in certain embodiments, there substrate pattern may have various imperfections or quality issues that are rectified by the block copolymer. The individual features patterned on the substrate may be smaller than or larger than the mean feature size of the block copolymer domains (or the desired feature size). There is also tolerance in the pitch or lattice spacing of the substrate pattern. In certain embodiments, the mean lattice spacing in the substrate pattern is about +/−0.1$L_o$.

Block Copolymer Material

The block copolymer material includes a block copolymer. The block copolymer may be comprised of any number of distinct block polymers (i.e. diblock copolymers, triblock copolymers, etc.). A specific example is the diblock copolymer PS-b-PMMA. Any type of copolymer that undergoes microphase separation under appropriate thermodynamic conditions may be used. This includes block copolymers that have as components glassy polymers such as PS and PMMA, which have relatively high glass transition temperatures, as well as more elastomeric polymers.

The block copolymer material may include one or more additional block copolymers. In some embodiments, the material may be a block copolymer/block copolymer blend. An example of a block copolymer/block copolymer blend is PS-b-PMMA (50 kg/mol)/PS-b-PMMA (100 kg/mol).

The block copolymer material may also include one or more homopolymers. In some embodiments, the material may be a block copolymer/homopolymer blend or a block copolymer/homopolymer/homopolymer blend, such as a PS-b-PMMA/PS/PMMA blend.

The block copolymer material may comprise any swellable material. Examples of swellable materials include volatile and non-volatile solvents, plasticizers and supercritical fluids. In some embodiments, the block copolymer material contains nanoparticles dispersed throughout the material. The nanoparticles may be selectively removed.

Film Characteristics

The methods described produce patterns with a high degree of perfection and registration at feature densities not obtainable by conventional lithographic methods. As described further below, the patterned block copolymer films may be used for pattern transfer, e.g., to create templates for nanoimprint lithography. The transferred patterns have the same high densities and quality characteristics as the block copolymer films.

Film Morphology

The film morphology may be any possible bulk or non-bulk morphology. In particular embodiments, the morphology is a perpendicular cylindrical morphology or a perpendicular lamellar morphology. According to various embodiments, the block copolymer film morphology may or may not match the bulk morphology of the block copolymer.

Density

Feature density is limited only by the critical dimensions (feature size and distance between features) obtainable with block copolymer films. Block copolymer films having critical dimensions as low as 2 nm or 3 nm have been observed. The methods are not limited to these dimensions but may be applied to any block copolymer material. As examples, block copolymer films having $L_o$ (e.g., cylinder center-to-center distance) of 50 nm correspond to feature densities of 300 gigafeature/in$^2$, which corresponds to 300 Gbit/in pattern media. $L_o$ of 20 nm corresponds to a density of about 1.9 terabit/in$^2$ and 10 nm to 7 Tbit/in$^2$. Using block copolymers materials with $L_o$ as low as 2 or 3 nm, densities greater than 100 Tbit/in$^2$ may be obtained. According to various embodiments, the patterns in the block copolymer films, or nanoimprint templates produced from these films, have densities of at least 500 Gfeature/in$^2$, 800 Gfeature/in$^2$, at least 1 Tfeature/in$^2$, at least 5 Tfeature/in$^2$, at least 6 Tfeature/in$^2$, at least 7 Tfeature/in$^2$, at least 8 Tfeature/in$^2$, at least 9 Tfeature/in$^2$, at least 10 Tfeature/in$^2$, at least 12 Tfeature/in$^2$ or at least 15 Tfeature/in$^2$.

Current state of the art lithographic methods have difficulty in producing films having greater than 500 Gbit/in$^2$ that also have the quality required for patterned media quality. E-beam and other conventional lithographic techniques sacrifice quality and writing speed for density; while e-beam lithography has been used to pattern hexagonally-closed packed dots at densities greater than 500 Gbit/in$^2$, the quality of these patterns is insufficient to meet pattern media standards, or in cases where especially high resolution resists are used, like CaF, the writing time becomes prohibitively long to produce a pattern large enough for a patterned media disk.

According to various embodiments, the block copolymer film patterns and resulting structures such as nanoimprint templates are characterized by one or more quality measurements including feature size distribution, feature placement error, placement of arrays of elements. The high quality patterns are made possible not only because of the pattern rectification described above, but also because density multiplication methods allow the initial substrate patterns to have lower density. Since feature and pattern quality of e-beam and optical lithography improves as feature density is lowered, density multiplication allows higher quality substrate patterns to be used.

Feature Size Distribution

The rectification methods described herein narrow feature size distribution over the substrate pattern feature size distribution. (It should be noted that while rectification makes the feature size more uniform, it does not necessarily result in the feature size of the bulk block copolymer material.) Feature size may be quantified by feature width or feature area. In certain embodiments, lamellar feature size may be feature width and dot feature size may be surface area (e.g., surface area of a cylinder end) or dot diameter. According to various embodiments, the standard deviation σ of dot diameter is no more than about 5% of mean feature diameter or width. In certain embodiments, standard deviation $\sigma_p$ of dot diameter is no more than about 2% of mean feature diameter or width. For dots, in certain embodiments, the standard deviation $\sigma_p$ of feature area is no more than 10% of mean feature area, or in certain embodiments, no more than 5% of mean feature area. In specific examples, $\sigma_p$ of feature area is less than 25 nm$^2$, less than 15 nm$^2$ or less than 10 nm$^2$. Also in certain embodiments, the up is no more than 50% of the standard deviation $\sigma_s$ of substrate pattern feature size (or of an e-beam lithographic pattern of the same feature density).

Placement Error

Figure 10:
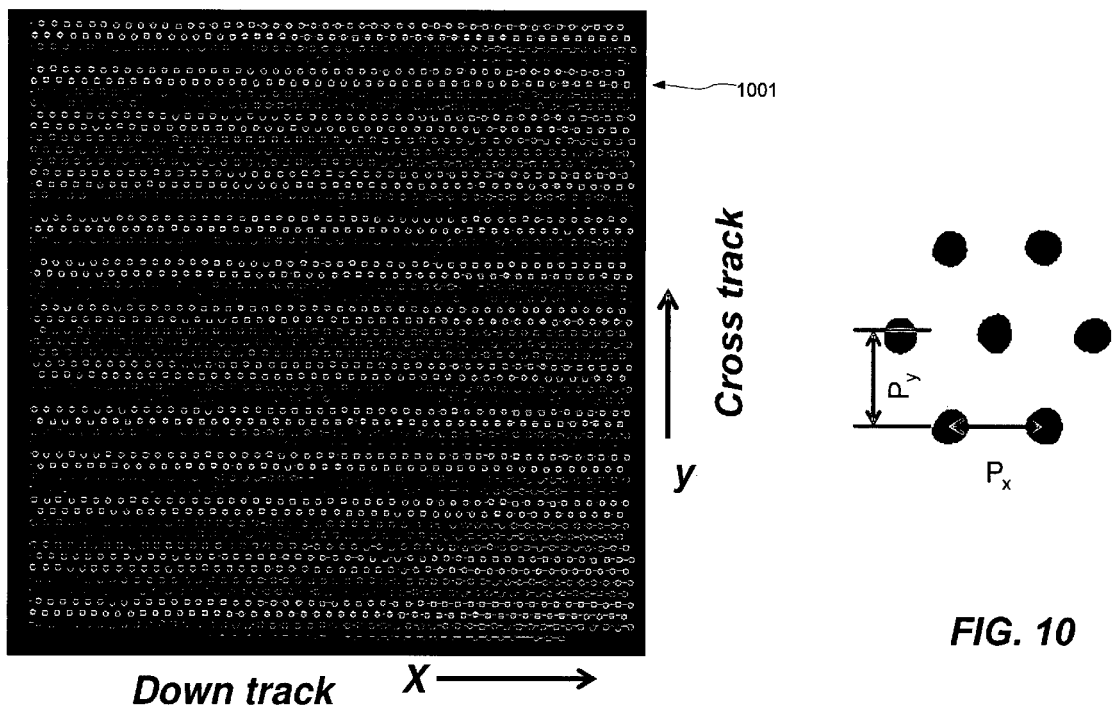
FIG. 10 shows an example of placement error as measured for hexagonally-arrayed bits of a pattern media disk.

Low placement error is important for pattern media. Read/write devices, such as a hard disk drive, are programmed to expect a bit every "x" nm along substantially circular tracks; if the placement error is too large and the bit is not where the device expects it to be, the data error rate increases. FIG. 10 shows an example of placement error as measured for hexagonally-arrayed bits of a pattern media disk 1001. In this example, cross-track (y) and down track (x) placement errors are measured. (In certain embodiments, the head flies along the circumferential down track bits.) Placement error P may be calculated as:

P=absolute value[(actual location of dot)−(ideal location of dot)]

In other embodiments, placement error P may be calculated for two adjacent dots may be calculated along each of the x and y axes as the absolute value of the difference of the actual dot placements vs. the ideal difference. According to various embodiments, the standard deviation $\sigma_p$ of placement error across all dots is no more than 5% of the pattern pitch $L_p$ or other characteristic length, or 2% of the pattern pitch. In certain embodiments, the standard deviation $\sigma_p$ of placement error is no more than 1 nm.

Figures 11A, 11B:
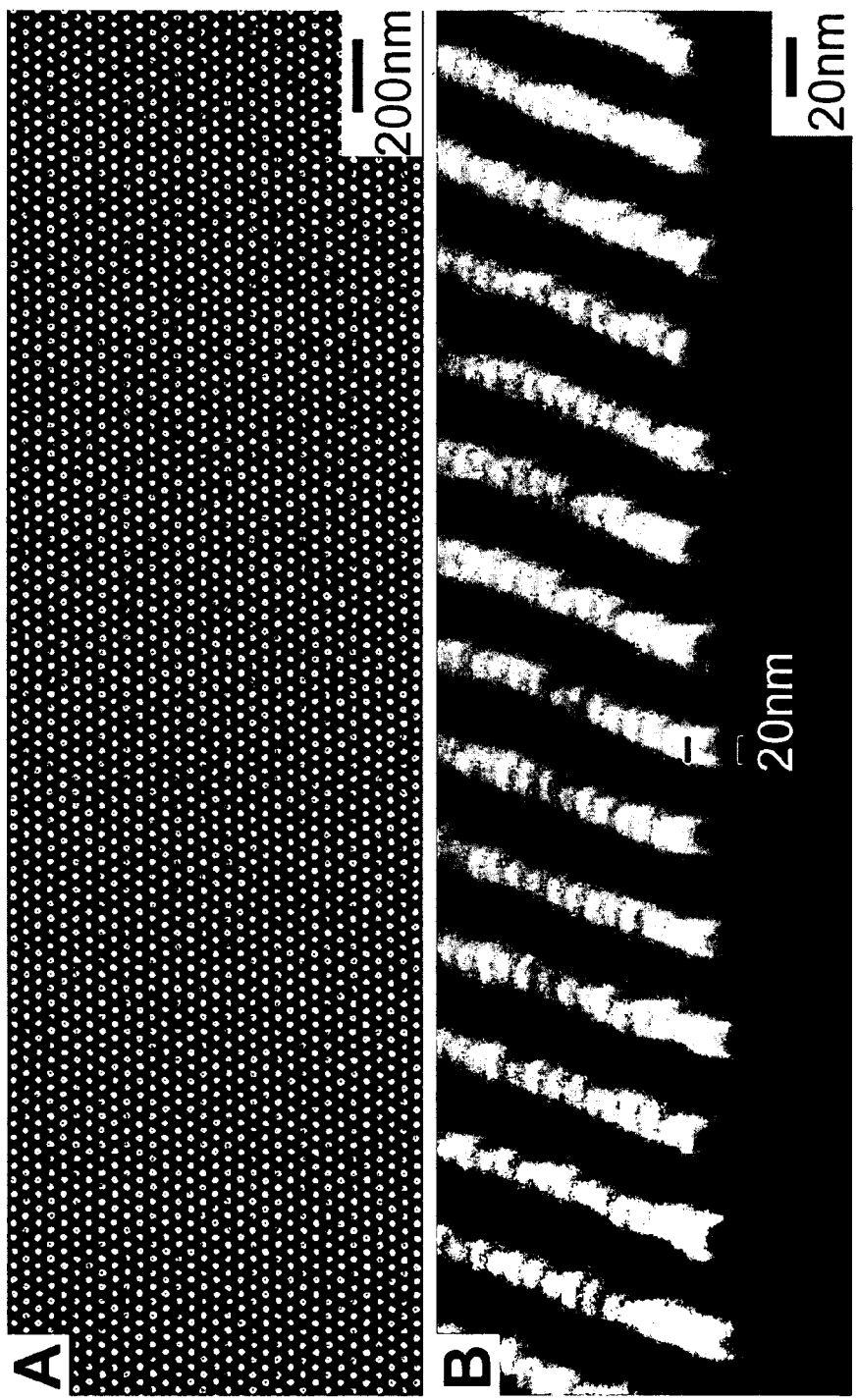
FIGS. 11A and 11B are images of a substrate at various stages in a pattern transfer process in which 20 nm tall Si pillars were created from a PMMA cylinder forming block copolymer film generated by methods described herein. The PMMA cylinder domain was removed and remaining pores were cleaned with oxygen plasma. 7 nm of Cr was deposited by e-beam evaporation and PS mask was removed using a piranha solution leaving a mask of Cr dots on the surface.

A technological benchmark for the quality of the patterns is garnered from transferring the pattern to the underlying substrate. The block copolymer film produced by density multiplication has a vertical side-wall profile suitable for pattern transfer. FIGS. 11A and 11B shows SEM images of pattern transfer using a directed block copolymer template with density multiplication ($L_p$=39 nm, $L_s$=78 nm). Using a lift-off technique 20 nm tall Si pillars were created. A block copolymer film like the one shown in FIG. 8F ($L_s$=78 nm, $L_p$=39 nm) was generated. The PMMA cylinder domain was removed and remaining pores were cleaned with oxygen plasma. 7 nm of Cr was deposited by e-beam evaporation and PS mask was removed using a piranha solution leaving Cr dots on the surface. FIG. 1A shows an SEM image of the Cr dots after lift-off. A CHF$_4$ reactive ion etch was used to generate 20 nm Si pillars. An SEM image of the 20 nm tall pillars etched using the Cr mask is shown in FIG. 1B. The pillars were uniform over the entire sample (3 mm long) and otherwise identical to those formed in patterns where $L_s$=39 nm. Taken together, molecular simulation and pattern transfer results demonstrate that the degree of perfection, registration and vertical sidewall profiles of the enhanced resolution templates provide a path based on e-beam patterning and directed assembly of block copolymers of bit patterned media at densities over 1 Tb/in$^2$.

Applications

Figure 12:
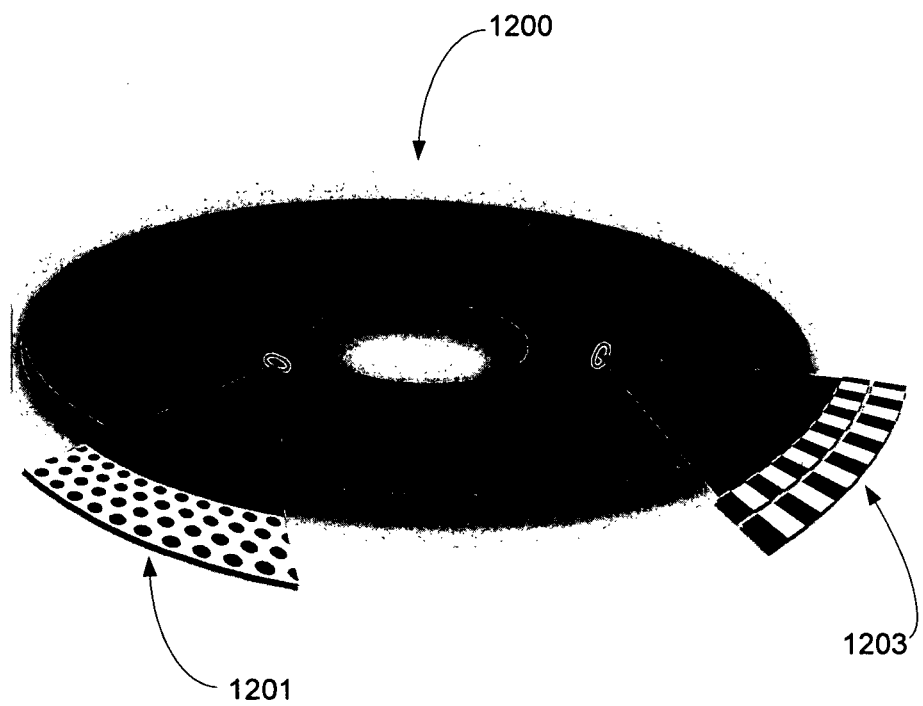
FIG. 12 shows an illustration of a patterned media disk.

Applications include pattern transfer as well as functionalizing one or more domains of the assembled block copolymer structure. In certain embodiments, patterned media and methods for fabricating pattern media are provided. FIG. 12 shows a patterned media disk 1200. Insets show dots 1201 and lines 1203 that may patterned on the disk for data storage. The methods described herein may be used to generate the patterns of dots, lines or other patterns for patterned media. According to various embodiments, the resulting block copolymer films, nanoimprint templates, and patterned media disks are provided. As discussed above, the nanoimprint templates and patterned disks have higher quality and higher density than conventional templates and disks.

In certain embodiments, a nanoimprint template is generated. A nanoimprint template is a substrate with a topographic pattern which is intended to be replicated on the surface of another substrate. There are several types of nanoimprinting processes. For UV-cure nanoimprinting, the template is a UV-transparent substrate (for example, made of quartz) with etched topographic features on one side. The patterned side of the template is brought into contact with a thin film of UV-curable liquid nanoimprint resist on the substrate to which the pattern is intended to be transferred. The liquid conforms to the topographic features on the template, and after a brief UV exposure, the liquid is cured to become a solid. After curing, the template is removed, leaving the solid resist with the replicated inverse topographic features on the second substrate. Thermal nanoimprinting is similar, except that instead of UV-light curing a liquid resist, heat is used to temporarily melt a solid resist to allow flow of the resist to conform with topographic features on the template; alternatively, heat can be used to cure a liquid resist to change it to a solid. For both approaches, the solid resist pattern is then used in subsequent pattern transfer steps to transfer the pattern to the substrate (or the resist may be used directly as a functional surface itself).

Figure 13A:
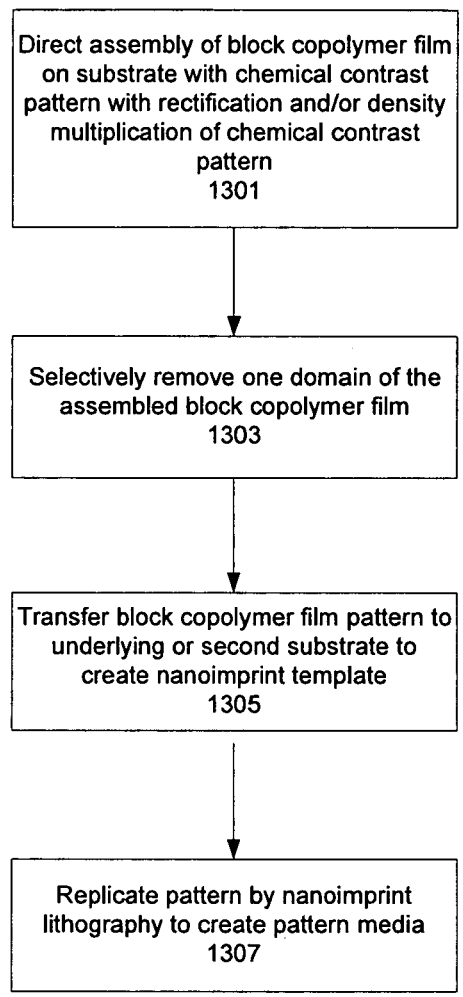
FIG. 13A is a process flow diagram illustrating operations in creating and using a nanoimprint template according to certain embodiments.

The nanoimprint template may be generated by selectively removing one phase of the block copolymer pattern and replicating the topography of the remaining polymer material with a molding or nanoimprinting process. In certain embodiments, the nanoimprint template may be generated with one or more additional pattern transfer operations. FIG. 13A is a process flow diagram illustrating operations in creating and using a nanoimprint template according to certain embodiments. First, a block copolymer film is directed to assemble on substrate with a chemical contrast pattern (1301). This is done in accordance with the methods described above with respect to FIGS. 3 and 5. One of the domains of the block copolymer film is then removed, e.g., by an oxygen plasma, thereby creating raised or recessed features (1303). The topographic pattern is then transferred to a substrate (1305). According to various embodiments, the pattern may be transferred by using the remaining polymer material as an etch mask for creating topography in the underlying substrate, or by replicating the topography in a second substrate using a molding or nanoimprinting process. The resulting structure is then replicated by nanoimprinting to create patterned media (1307). The flow diagram shown in FIG. 13 is just an example of a process. In certain embodiments, the structure created by selective removal of one of the polymer phases in 1303 may be used as the patterned media template, e.g., after treating or functionalizing the remaining phase. In other embodiments, additional pattern transfer operations may occur between generating the block copolymer film and creating patterned media.

Figure 13B:
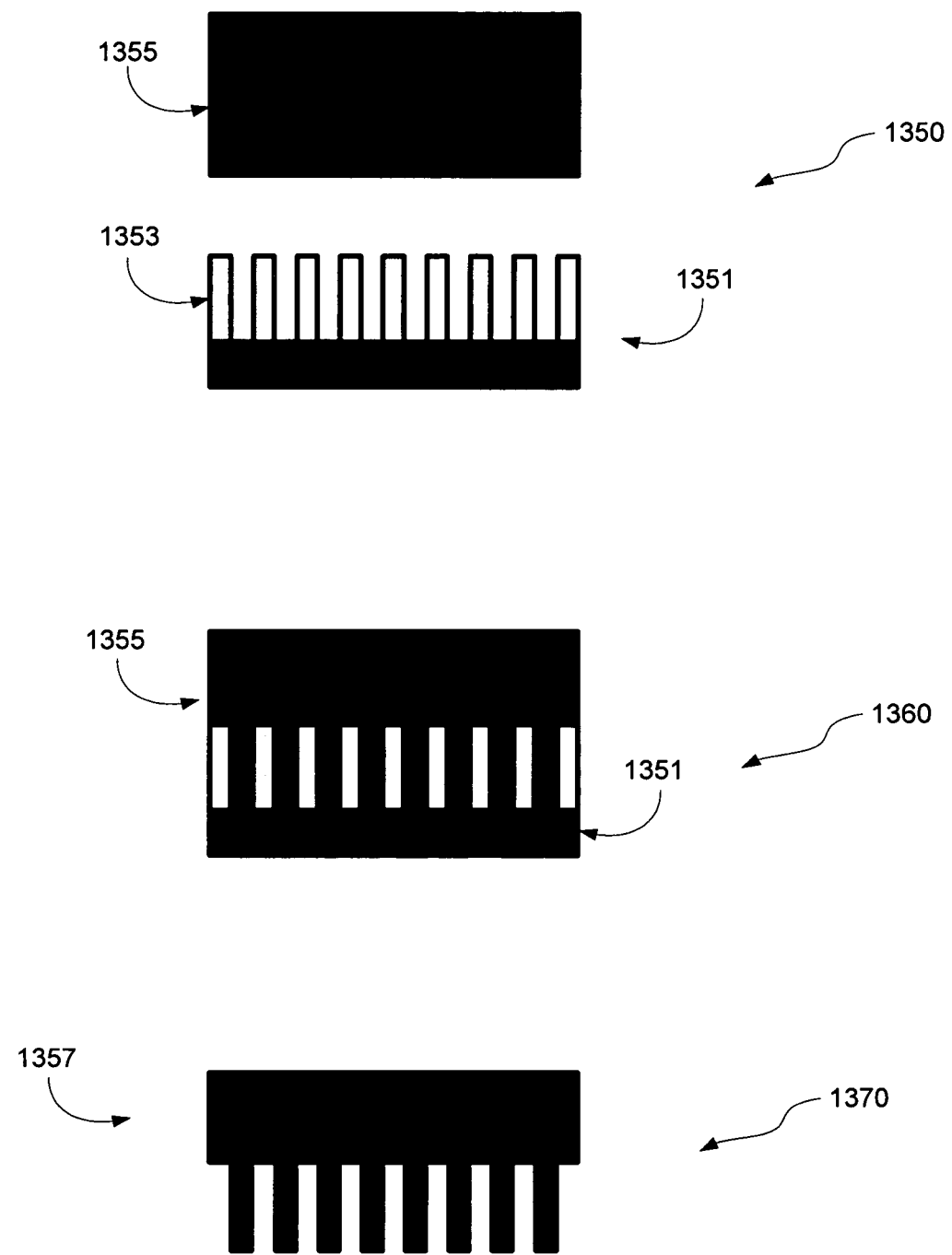
FIG. 13B illustrates an example of a nanoimprint process using a template according to various embodiments.

FIG. 13B illustrates an example of a nanoimprint process using a template according to various embodiments. First, at 1350, a cross-section of a nanoimprint template 1351 having features 1353 is shown. (Note that the features 1353 are raised; alternatively the recesses between these raised pillars or cylinders may be considered features). A second substrate to which the patterned is to be transferred is shown at 1355. According to various embodiments, template 1351 may be a block copolymer film after selective removal of one phase, or may have been generated as described above in operation 1305 of FIG. 13A. Similarly, second substrate 1355 may be a disk to be patterned for data storage or an intermediate component in generating such as disk. In certain embodiments, a layer of resist (e.g., a UV-curable liquid resist) is on the substrate 1355.

At 1360, the second substrate 1355 is brought into contact with template 1351, thereby replicating the topography of the template. For example, a liquid resist on substrate 1355 conforms to the topographic features on the template, and after a brief UV exposure, the liquid is cured to become a solid. The resulting patterned structure 1357 is shown at 1370.

Figure 14:
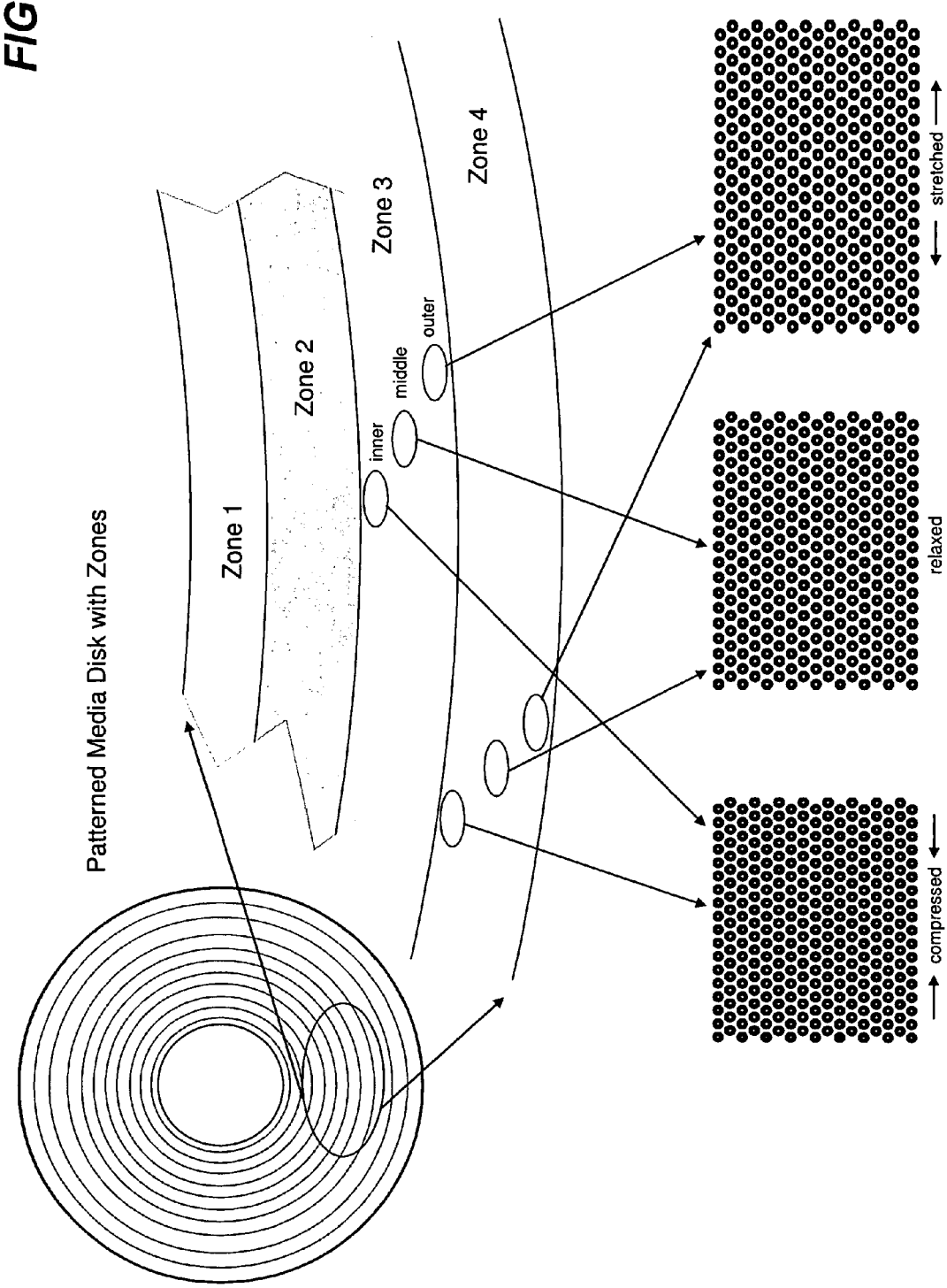
FIG. 14 shows an example of a patterned media disk patterned with hexagonally arrayed dots.

In many patterned media applications, the patterned media is in the form of a circular disk, e.g., to be used in hard disk drives. These disks typically have inner diameters as small as 7 mm and outer diameters as large as 95 mm. The patterned features may be arranged in circular tracks around a center point. The block copolymer films used to fabricate these patterned media disks are also circular. In certain embodiments, the patterns on the original substrate, the assembled block copolymer films, the nanoimprint templates and the pattern media are divided into zones, with the angular spacing of the features (dots) within a zone constant. FIG. 14 shows an example of a patterned media disk patterned with hexagonally arrayed dots. The nominally hexagonal pattern of dots is relaxed near the center of each radial zone. Within each zone or circumferential band, however, the pattern becomes compressed in the circumferential (but not radial) direction moving in toward the center of the disk. Likewise, within each zone, the pattern is circumferentially stretched moving outward toward the edge of the disk away from the center.

Each zone is made up of dots on circular tracks (so that a head can fly along a track circumferentially to read or write data). According to various embodiments, the stretching and compression is done in a way such that the number of dots all the way around a single track is constant. This means that the dots are arranged with constant angular spacing along a track, when viewing rotationally with respect to the center of the disk. This also means that the circumferential spacing of the dots within a single zone scales with the radius. Thus, the amount of stretching and compressing needed corresponds to the radial width of a zone. The spacing between tracks is kept constant; only the circumferential direction gets stretched or compressed.

Each zone has its own constant angular spacing of dots, and that spacing is chosen so that the self-assembled pattern is in the relaxed state near the center of the zone. For example, if we are using block copolymers with a natural period of 39 nm, then the spacing of dots in the center of each zone is 39 nm, and is more compressed (e.g., 36 nm spacing) along a track at the inner edge of a zone, and stretched (e.g., 42 nm spacing) at the outer edge of a zone. In FIG. 14, the pattern in the middle of zones 3 and 4 is the relaxed pattern (same periodicity in both zones). Likewise, at the outer edge of both zones 3 and 4, the pattern has been stretched by a comparable amount. For self-assembly of block copolymers, the precursor e-beam pattern is written with this zone-wise stretching and compression. If each zone is not too wide, the block copolymer forms a commensurate pattern on the precursor pattern, following the compression and stretching that has been written by the e-beam into the precursor pattern. As described above, the block copolymer film assembly is fairly tolerant, allowing the distance between dots on the chemical pattern to vary by +/−0.1$L_o$. This allows a block copolymer film deposited on a zone to form a commensurate pattern. According to various embodiments, the width of the zone may be on the order of 1 mm, though this can vary depending on the pattern and the block copolymer used.

Figure 15:
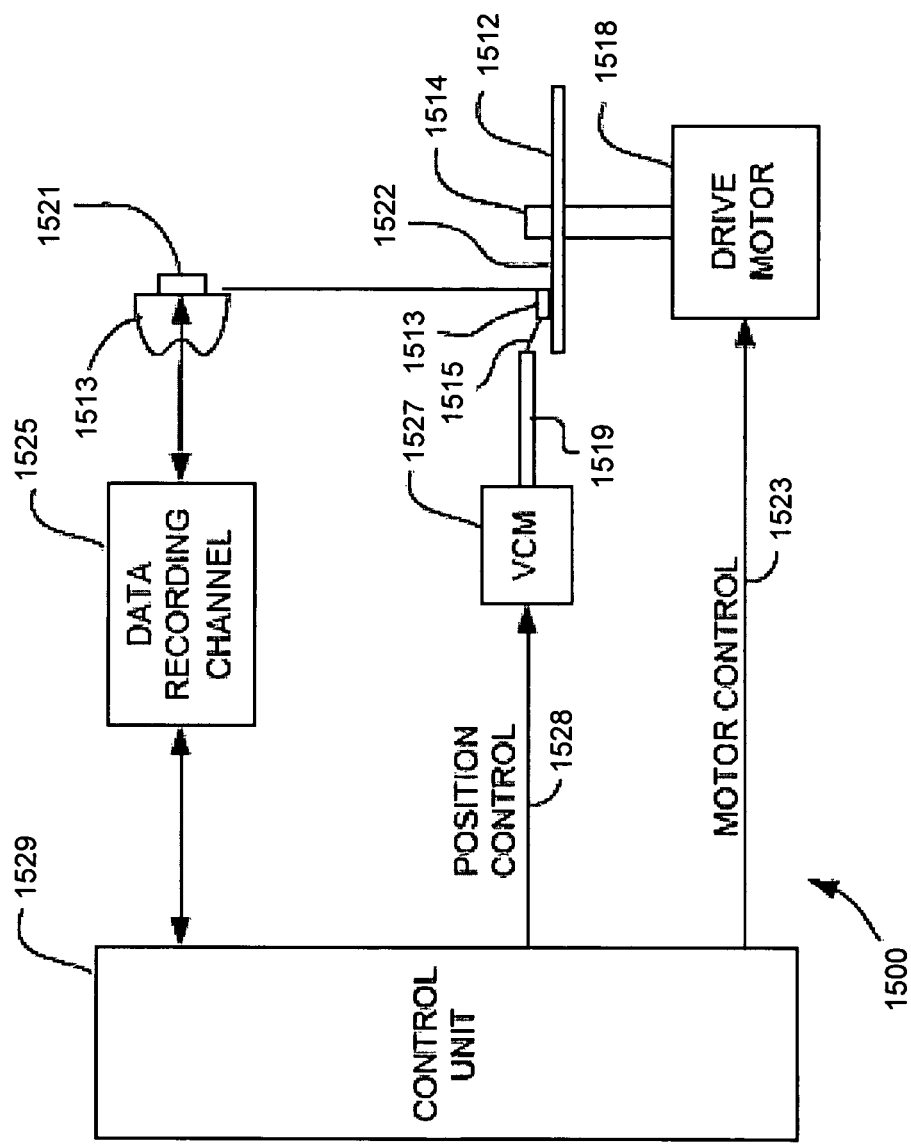
FIG. 15 shows components of a disk drive system according to certain embodiments.

Also provided are disk drive systems having rotatable magnetic disks, such as those described above. Referring now to FIG. 15, there is shown a disk drive 1500 in accordance with one embodiment of the present invention. As shown in FIG. 15, at least one rotatable magnetic disk 1512 is supported on a spindle 1514 and rotated by a disk drive motor 1518. The magnetic recording on each disk is typically in the form of an annular pattern of concentric data tracks (not shown) on the disk 1512.

At least one slider 1513 is positioned near the disk 1512, each slider 1513 supporting one or more magnetic read/write heads 1521. As the disk rotates, slider 1513 is moved radially in and out over disk surface 1522 so that heads 1521 may access different tracks of the disk where desired data are recorded and/or to be written. Each slider 1513 is attached to an actuator arm 1519 by means of a suspension 1515. The suspension 1515 provides a slight spring force which biases slider 1513 against the disk surface 1522. Each actuator arm 1519 is attached to an actuator 1527. The actuator 1527 as shown in FIG. 15 may be a voice coil motor (VCM). The VCM comprises a coil movable within a fixed magnetic field, the direction and speed of the coil movements being controlled by the motor current signals supplied by controller 1529.

During operation of the disk storage system, the rotation of disk 1512 generates an air bearing between slider 1513 and disk surface 1522 which exerts an upward force or lift on the slider. The air bearing thus counter-balances the slight spring force of suspension 1515 and supports slider 1513 off and slightly above the disk surface by a small, substantially constant spacing during normal operation. Note that in some embodiments, the slider 1513 may slide along the disk surface 1522.

The various components of the disk storage system are controlled in operation by control signals generated by control unit 1529, such as access control signals and internal clock signals. Typically, control unit 1529 comprises logic control circuits, storage (e.g., memory), and a microprocessor. The control unit 1529 generates control signals to control various system operations such as drive motor control signals on line 1523 and head position and seek control signals on line 1528. The control signals on line 1528 provide the desired current profiles to optimally move and position slider 1513 to the desired data track on disk 1512. Read and write signals are communicated to and from read/write heads 1521 by way of recording channel 1525.

The above description of a typical magnetic disk storage system, and the accompanying illustration of FIG. 15 is for representation purposes only. It should be apparent that disk storage systems may contain a large number of disks and actuators, and each actuator may support a number of sliders.

Although the foregoing invention has been described in some detail for purposes of clarity of understanding, it will be apparent that certain changes and modifications may be practiced within the scope of the invention. It should be noted that there are many alternative ways of implementing both the process and compositions of the present invention. Accordingly, the present embodiments are to be considered as illustrative and not restrictive, and the invention is not to be limited to the details given herein.

All references cited are incorporated herein by reference in their entirety and for all purposes.

The invention claimed is:

1. A nanoimprint template comprising: a template body; and a plurality of tracks on the template body that extend circumferentially around a center point, the tracks comprising recessed or raised periodic features, wherein the density of said features is greater than about 1 tera-feature per square inch, wherein the features are arranged in cross-track and down-track directions, the cross-track direction extending radially from the center point and the down-track direction extending circumferentially along the plurality of tracks, wherein the features are evenly spaced in the cross-track direction over a distance of at least 1 millimeter, and wherein each feature comprises a top surface having a lateral dimension, wherein the standard deviation of the lateral dimensions of the features is no more than about 5% of the mean lateral dimension.

2. A patterned media disk comprising: a circular disk; and a plurality of data tracks that extend circumferentially around the disk, the data tracks comprising recessed or raised periodic features, wherein the density of said features is greater than about 1 tera-feature per square inch, wherein the features are arranged in cross-track and down-track directions, the cross-track direction extending radially from the disk center and the down-track direction extending circumferentially around the disk, wherein the features are evenly spaced in the cross-track direction over a distance of at least 1 millimeter, and wherein each feature comprises a top surface having a lateral dimension, wherein the standard deviation of the lateral dimensions of the features is no more than about 5% of the mean lateral dimension.

3. The patterned media disk of claim 2 wherein the density of said features is greater than about 2 tera-features per square inch.

4. The patterned media disk of claim 2 wherein the density of said features is greater than about 7 tera-features per square inch.

5. The patterned media disk of claim 2 wherein the standard deviation σ of feature placement error from an ideal periodic pattern is no more than about 1 nm.

6. The patterned media disk of claim 2 wherein the standard deviation σ of feature placement error from an ideal pattern is no more than about 5% of the ideal pattern pitch.

7. The patterned media disk of claim 2 wherein the standard deviation σ of feature placement error from an ideal pattern is no more than about 2% of the ideal pattern pitch.

8. The patterned media disk of claim 2 wherein the features are arranged in a two-dimensional array and the standard deviation of the feature placement error from an ideal array is no more than about 1 nm.

9. The patterned media disk of claim 2 wherein each feature comprises a top surface having a top surface area, wherein the standard deviation of the size distribution of the top surface areas of the features is no more than about 5% of the mean feature size.

10. The patterned media disk of claim 2 wherein each feature comprises a top surface having a top surface area, wherein the standard deviation of the top surface areas of the features is no more than about 2% of the mean feature size.

11. The patterned media disk of claim 2 wherein the features are arranged in an annular band having an inner diameter of at least about 7 mm and an outer diameter of no more than about 98 mm.

12. The patterned media disk of claim 2 further comprising a plurality of circumferential bands, each comprising a plurality of data tracks, wherein each band comprises features at a constant angular periodicity about the disk center.

13. The patterned media disk of claim 2 wherein the features have long range order over a surface area of at least about ten square cm.

14. The patterned media disk of claim 2 wherein the features are pillars raised above a disk surface.

15. The patterned media disk of claim 2 wherein the features are recessed below a disk surface.

16. The patterned media disk of claim 2 wherein the features are arranged in a pattern transferred from a block copolymer film.

17. The patterned media disk of claim 16 wherein the pattern is transferred from a block copolymer film via at least one nanoimprint template.

18. A magnetic disk drive system, comprising:
a patterned media disk comprising a circular disk; and a plurality of data tracks that extend circumferentially around the disk, the data tracks comprising recessed or raised periodic features, wherein the density of said features is greater than about 1 tera-feature per square inch, wherein the features are arranged in cross-track and down-track directions, the cross-track direction extending radially from the disk center and the down-track direction extending circumferentially around the disk, wherein the features are evenly spaced in the cross-track direction over a distance of at least 1 millimeter, and wherein each feature comprises a top surface having a lateral dimension, wherein the standard deviation of the lateral dimensions of the features is no more than about 5% of the mean lateral dimension;
a hub holding said patterned media disk rotatably;
a spindle motor rotating said hub;
a magnetic head recording or reproducing information to or from said patterned media disk; and
an actuator holding and locating said magnetic head at a predetermined position on said patterned media disk.

19. The patterned media disk of claim 2, wherein a pattern of the features of the media disk corresponds to a block copolymer film assembled on a patterned substrate.

20. The magnetic disk drive system of claim 18, wherein the features are pillars raised above a disk surface.

* * * * *